(12) United States Patent
Hegde

(10) Patent No.: US 6,631,756 B1
(45) Date of Patent: Oct. 14, 2003

(54) HIGH PERFORMANCE PASSIVE COOLING DEVICE WITH DUCTING

(75) Inventor: Shankar Hegde, Annassandrapalya Bangalore (IN)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/238,144

(22) Filed: Sep. 10, 2002

(51) Int. Cl.7 .................................................. H05K 7/20
(52) U.S. Cl. ....................... 165/80.3; 165/121; 361/697
(58) Field of Search ................................ 165/80.3, 121, 165/185; 361/697, 704, 710; 257/719, 722; 174/16.3

(56) References Cited

U.S. PATENT DOCUMENTS

| | | | |
|---|---|---|---|
| 5,132,780 A | * | 7/1992 | Higgins, III ................ 257/722 |
| 5,597,034 A | * | 1/1997 | Barker et al. .............. 165/80.3 |
| 5,946,190 A | | 8/1999 | Patel et al. |
| 5,975,194 A | * | 11/1999 | Wagner ..................... 165/80.3 |
| 6,134,108 A | | 10/2000 | Patel et al. |
| 6,206,087 B1 | | 3/2001 | Nakase et al. |
| 6,349,554 B2 | | 2/2002 | Patel et al. |
| 6,360,816 B1 | | 3/2002 | Wagner |
| 6,505,680 B1 | * | 1/2003 | Hegde ........................ 165/80.3 |
| 6,538,888 B1 | * | 3/2003 | Wei et al. ................... 361/697 |
| 6,552,902 B2 | * | 4/2003 | Cho et al. ................... 361/704 |

* cited by examiner

Primary Examiner—Allen Flanigan
(74) Attorney, Agent, or Firm—Trueman H. Denny, III

(57) ABSTRACT

A passive cooling device for removing waste heat from a component is disclosed. The passive cooling device includes a heat mass and a stem extending outward therefrom and including a plurality of fins formed in the stem. The stem includes a plurality of stem fins with stem slots therebetween. A plurality of vanes that include fins formed therein surround the stem and define a chamber. A duct connects with a top face of the vanes and an air flow source that generates an air flow through the chamber, the stem fins, the fins, and the vanes to dissipate heat from the heat mass. The air flow source can supply a positive or a negative air flow.

20 Claims, 17 Drawing Sheets

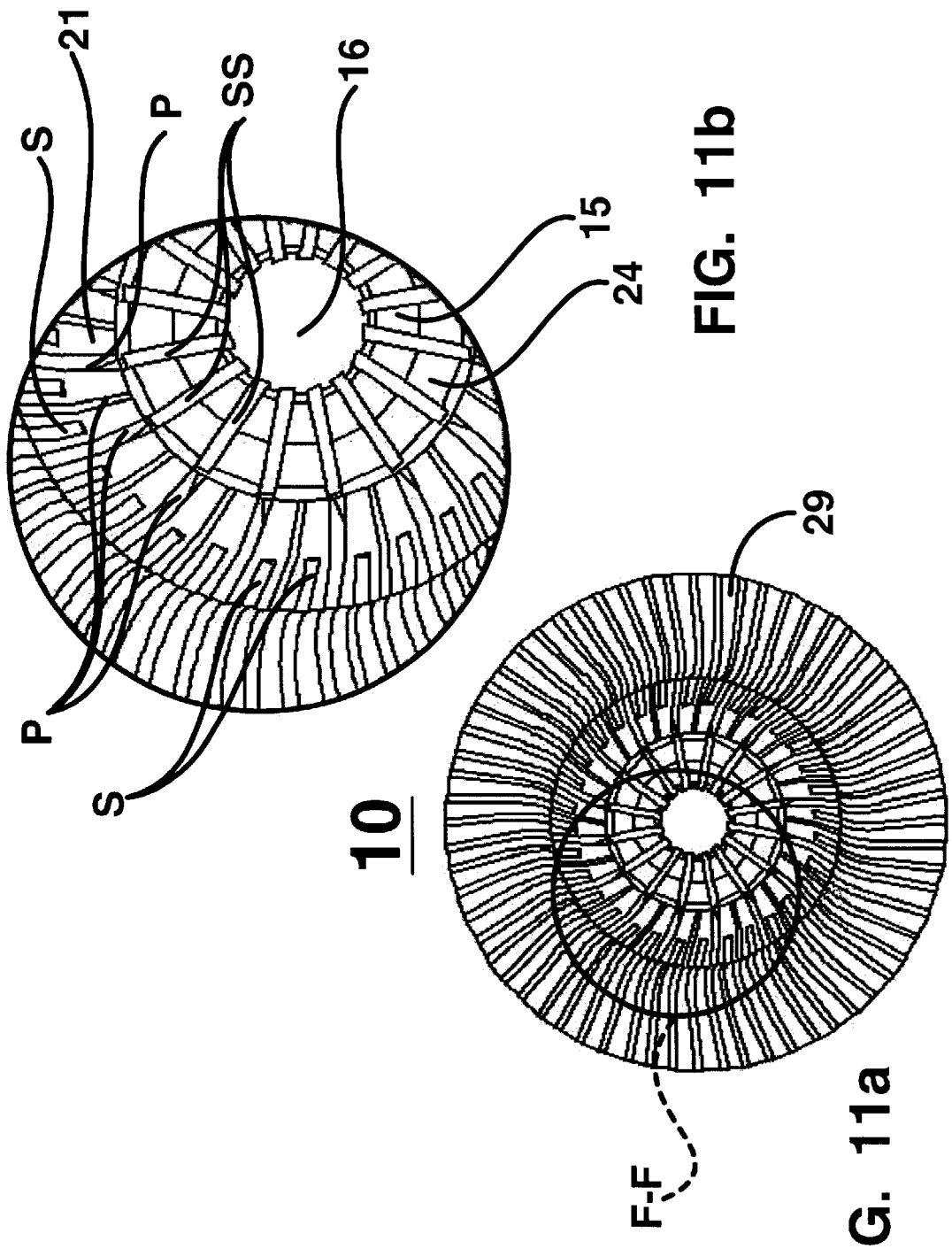

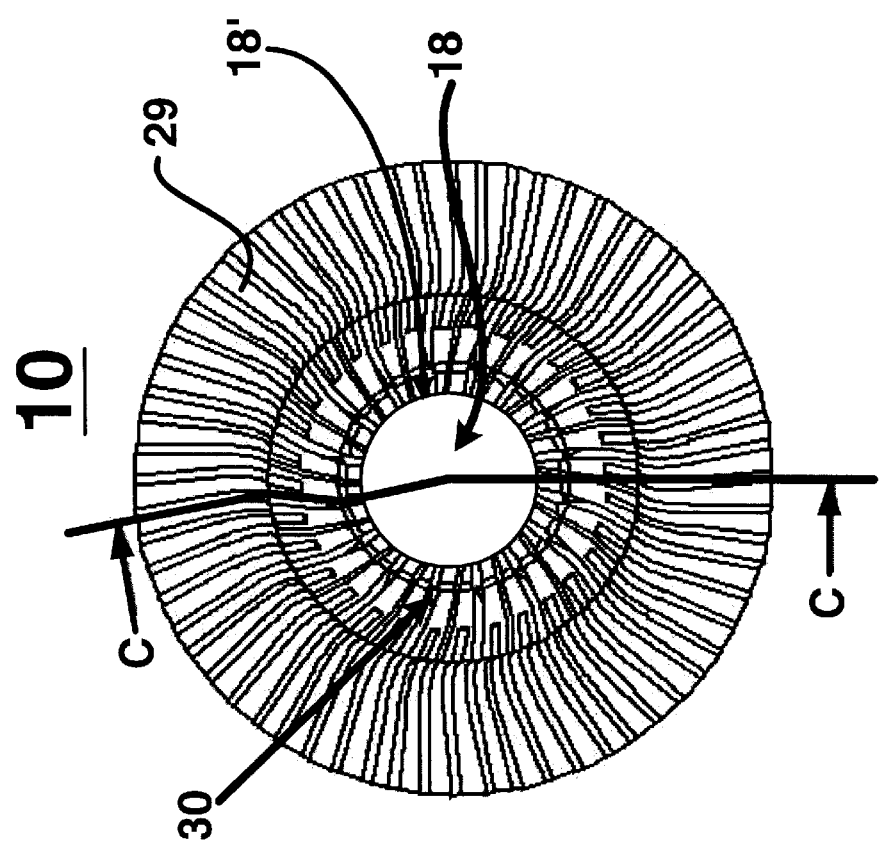
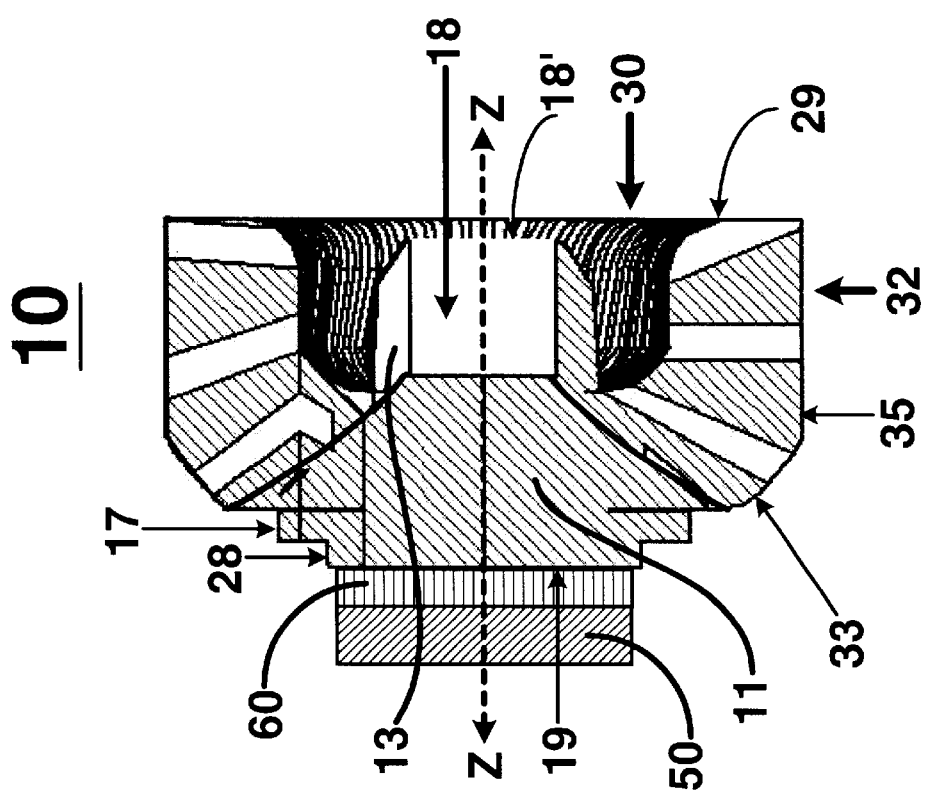

HIGH PERFORMANCE PASSIVE COOLING DEVICE WITH DUCTING

FIELD OF THE INVENTION

The present invention relates generally to a passive cooling device for dissipating heat from a component connected with the passive cooling device. More specifically, the present invention relates to a passive cooling device for dissipating heat from a component connected with the passive cooling device and including a duct for channeling an air flow between an air flow source and the passive cooling device.

BACKGROUND OF THE INVENTION

It is well known in the electronics art to place a heat sink in contact with an electronic device so that waste heat generated by operation of the electronic device is thermally transferred into the heat sink thereby cooling the electronic device. With the advent of high clock speed electronic devices such as microprocessors ($\mu$P), digital signal processors (DSP), and application specific integrated circuits (ASIC), the amount of waste heat generated by those electronic devices and the operating temperature of those electronic devices are directly proportional to clock speed. Therefore, higher clock speeds result in increased waste heat generation which in turn increases the operating temperature of the electronic device. However, efficient operation of the electronic device requires that waste heat be continuously and effectively removed.

Heat sink devices came into common use as a preferred means for dissipating waste heat from electronic devices such as the types described above. In a typical application, a component to be cooled is carried by a connector that is mounted on a PC board. A heat sink is mounted on the component by attaching the heat sink to the connector using a clip or fasteners, for example. Alternatively, the heat sink is mounted to a PC board that carries the electronic device and fasteners or the like are used to connect the heat sink to the PC board via holes that are drilled in the PC board.

Typically, a heat sink used in conjunction with a modern high clock speed electronic device will include an electrical fan mounted on top of the heat sink or within a cavity formed by cooling fins/vanes of the heat sink. The cooling fins increase the surface area of the heat sink and maximize heat transfer from the heat sink to ambient air that surrounds the heat sink. The fan causes air to circulate over and around the cooling fins thereby transferring heat from the cooling fins into the ambient air.

As mentioned previously, with continuing increases in clock speed, the amount of waste heat generated by electronic devices has also increased. Accordingly, to adequately cool those electronic devices, larger heat sinks and/or larger fans are required. Increasing the size of the heat sink results in a greater thermal mass and a greater surface area from which the heat can be dissipated. A larger fan increases air flow through the cooling fins.

There are disadvantages to increased fan and heat sink size. First, if the size of the heat sink is increased in a vertical direction (i.e. in a direction transverse to the PC board), then the heat sink is tall and may not fit within a vertical space in many applications, such as the chassis of a desktop computer. Second, if the PC board has a vertical orientation, then a tall and heavy heat sink can mechanically stress the PC board and/or the electronic device resulting in a device or PC board failure.

Third, a tall heat sink will require additional vertical clearance between the heat sink and a chassis the heat sink is contained in to allow for adequate air flow into or out of the fan. Fourth, if the heat sinks size is increased in a horizontal direction, then the amount of area available on the PC board for mounting other electronic devices is reduced. Fifth, when the heat sink has a cylindrical shape formed by the fins it is often not possible to mount several such heat sinks in close proximity to each other because air flow into and out of the fins is blocked by adjacent heat sinks with a resulting decrease in cooling efficiency.

Finally, increases in fan size to increase cooling capacity often result in increased noise generation by the fan. In many applications such as the desktop computer or a portable computer, it is highly desirable to minimize noise generation. In portable applications that depend on a battery to supply power, the increased power drain of a larger fan is not an acceptable solution for removing waste heat.

In the above mentioned heat sink with cooling fins there are additional disadvantages to mounting the fan within a cavity formed by the fins. First, a substantial portion of a heat mass of the heat sink is partially blocked by the fan because the fan is mounted directly on the heat mass and therefore blocks a potential path for heat dissipation from the heat mass because air from the fan does not circulate over the blocked portion of the heat mass.

Second, without the fan, a depth of the fins could extend all the way to a center of the heat mass; however, the depth and surface area of the fins is reduced by a diameter of the fan because the fan is mounted in a cavity having a diameter that is slightly larger than the fans diameter to provide clearance for the fan blades. Consequently, the heat mass of the heat sink must be made broader to compensate for the reduced surface area of the fins. The broader heat mass increases the size, cost, and weight of the heat sink.

Third, the reduced depth of the fins makes it easier for the fins to be bent if damaged. One possible consequence of a bent fin is that it will contact and damage the fan blades and/or cause the fan to stall thereby damaging the fan or causing the fan to fail. Fourth, because the fan is mounted in the cavity formed by the fins, power leads for the fan must be routed through a space between the fins. Sharp edges on the fins can cut the power leads or cause an electrical short. In either case, the result is that the fan will fail. Fifth, glue is typically used to mount the fan to the heat sink and the glue can get into the fan and cause the fan to fail. Any of the above mentioned failure modes can lead to a failure of the electronic device the heat sink was designed to cool because air circulation generated by the fan is essential to effectively dissipate waste heat from the electronic device.

Lastly, the fan itself is typically connected with the fins of the heat sink or is positioned in a cavity between the fins. Therefore, the heat sink is actively cooled by a direct connection with the fan that generates an air flow through the fins. Because of the proximity of the fan with the fins, the air flow is turbulent and that turbulence generates noise in addition to the noise generated by the operation of the fan itself.

Consequently, there exists a need for a passive cooling device that overcomes the aforementioned disadvantages associated with prior actively cooled fan assisted heat sinks. Moreover, there is a need for a passive cooling device that receives an air flow from an air flow source that is not directly connected with the passive cooling device. Finally, there is a need for a passive cooling device adapted to receive a laminar air flow that efficiently dissipates waste heat at reduced noise levels.

SUMMARY OF THE INVENTION

Broadly, the present invention is embodied in a passive cooling device for dissipating heat from a component to be cooled. The passive cooling device includes a heat mass, a stem connected with the heat mass and extending outward of the heat mass. The stem is symmetrically positioned about an axis of the heat mass and the stem includes a diverter surface, an end face, and a plurality of stem fins that are spaced apart to define a stem slot between adjacent stem fins. The stem slots extend to the heat mass. A heat conductive base is in contact with the heat mass and includes a mounting surface that is adapted to thermally connect the heat mass with the component.

A plurality of vanes are connected with the heat mass and are spaced apart to define a primary slot between adjacent vanes. The primary slot extends to the heat mass. Each vane also includes at least one secondary slot therein that extends through a portion of the vane and defines a plurality of fins in each vane.

Each vane also includes an inner wall that terminates at a top face. The inner wall of all the vanes defines a chamber that surrounds the stem. A portion of the inner wall and the stem defines a cavitation section. Each vane further includes an outer wall that also terminates at the top face.

The passive cooling device further includes an air flow source for generating an air flow and a duct for channeling the air flow between the air flow source and the passive cooling device. The duct includes a first opening positioned adjacent to the top face and a second opening adapted to connect with the air flow source. Heat is dissipated from the component by the air flow passing over the stem, the stem fins, the fins, and the vanes and flowing through the stem slots, the primary slots, and the secondary slots such that heat conducted from the component and into the heat mass is transferred into the air flow.

Because the air flow source is not directly connected with the passive cooling device, the fan blades will not be damaged by a bent fin. A wire, such as a power lead for the fan, will not be cut or shorted by the vanes because the power lead need not be routed through the vanes and is positioned away from the vanes.

Moreover, the vanes of the present invention can extend deep into the heat mass because the fan is not in contact with the heat mass and is not positioned between the vanes so that the heat mass is not blocked by the fan. As a result, a surface area of the vanes can be increased over prior heat sink designs and that increased surface area improves heat dissipation from the heat mass.

The aforementioned problems associated with fan noise and air turbulence are also reduced by the present invention because the air flow in the duct reduces noise caused by air turbulence and because the fan blades are positioned away from the vanes and fins thereby further reducing air turbulence noise.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 6b is a detailed view of section E—E of FIG. 6a.

FIG. 10b is a cross-sectional view of the passive cooling device taken along line C—C of FIG. 10a.

FIG. 11a is a top plan view depicting stem slots which merge with a preselected number of primary slots according to the present invention.

FIG. 11b is an enlarged top plan view of section F—F of FIG. 11a.

FIG. 12b is an enlarged top plan view of section G—G of FIG. 12a.

FIG. 13a is a top plan view of a passive cooling device including a stem cavity according to the present invention.

FIGS. 13b and 13c are a cross-sectional views of the passive cooling device taken along line C—C of FIG. 13a.

DETAILED DESCRIPTION

Figure 1:
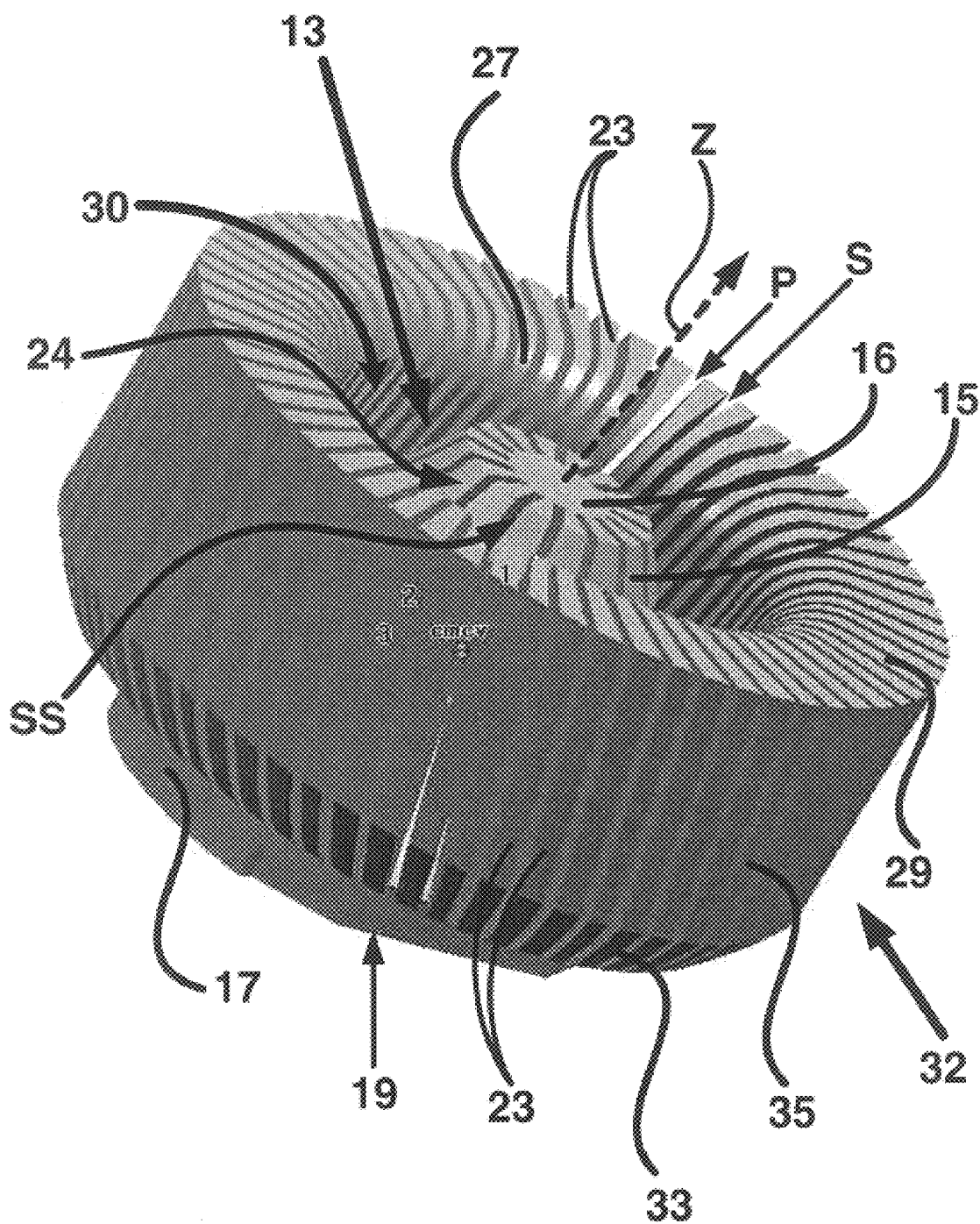
FIG. 1 is a profile view of a passive cooling device according to the present invention.
Figure 2:
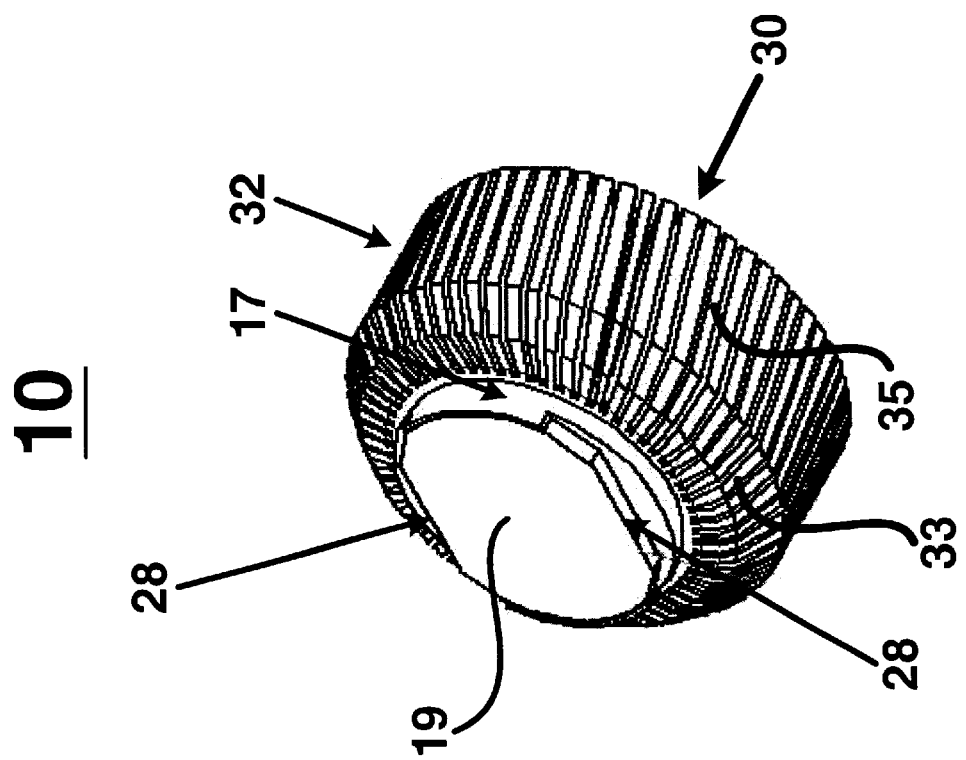
FIG. 2 is a bottom profile view of a passive cooling device according to the present invention.
Figure 3:
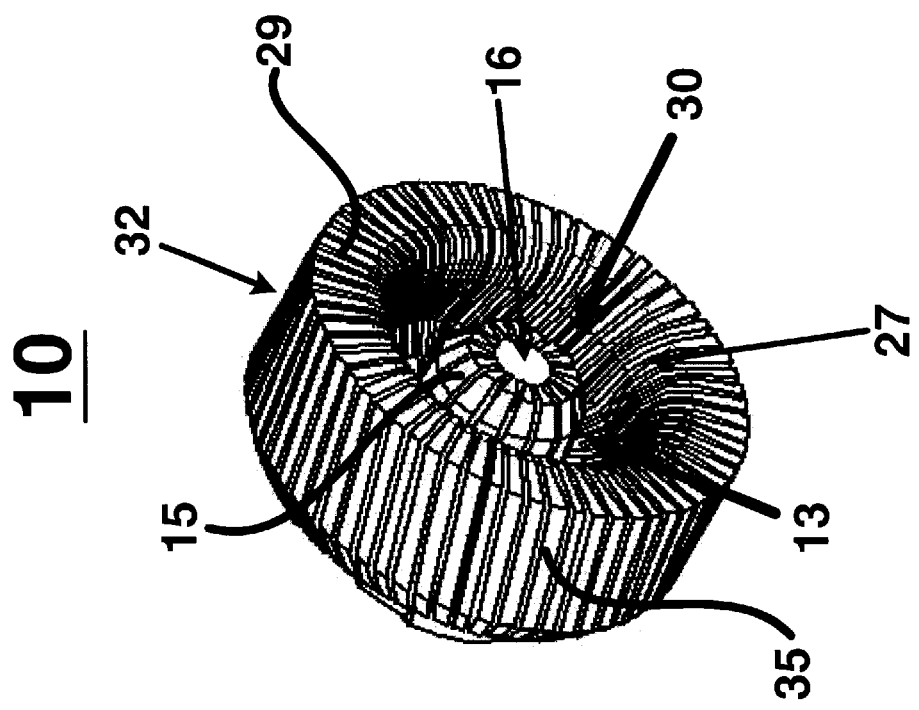
FIG. 3 is a top profile view of a passive cooling device according to the present invention.
Figure 5:
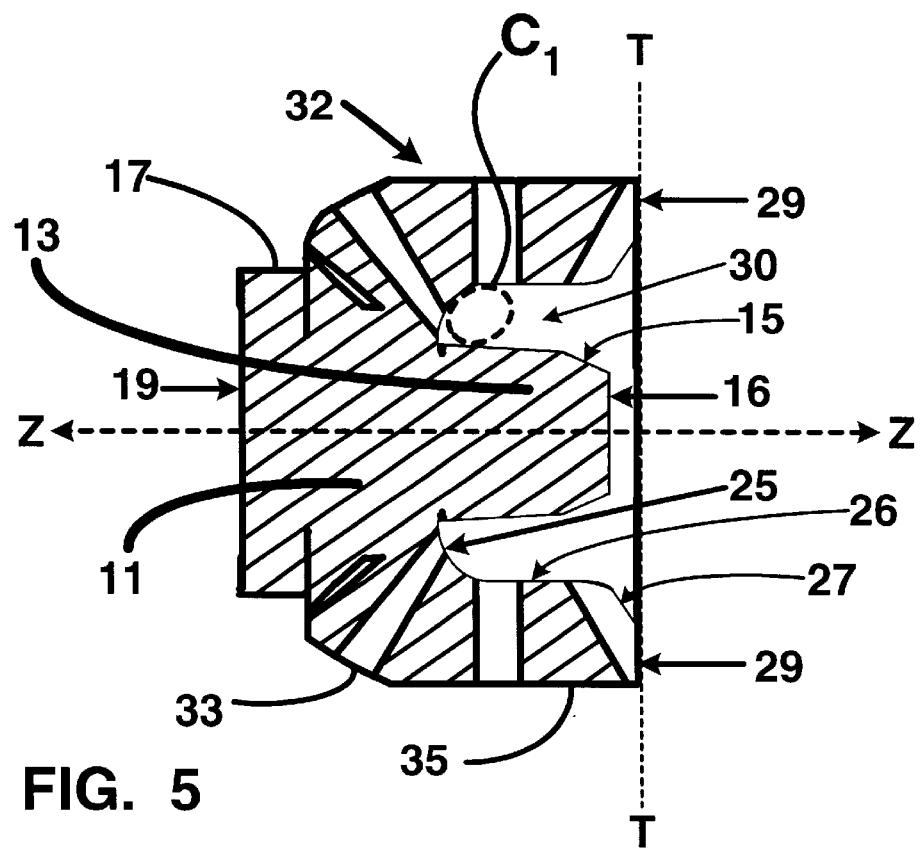
FIG. 5 is a cross-sectional view of the passive cooling device of FIG. 4 taken along line A—A.
Figure 4:
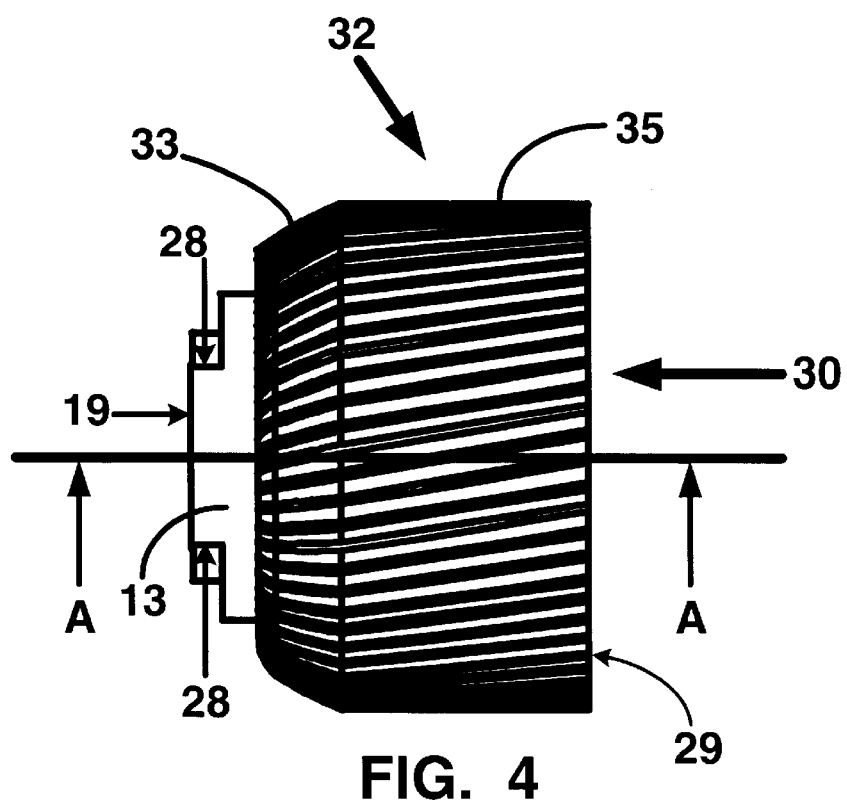
FIG. 4 is a side plan view of a passive cooling device according to the present invention.
Figure 6B:
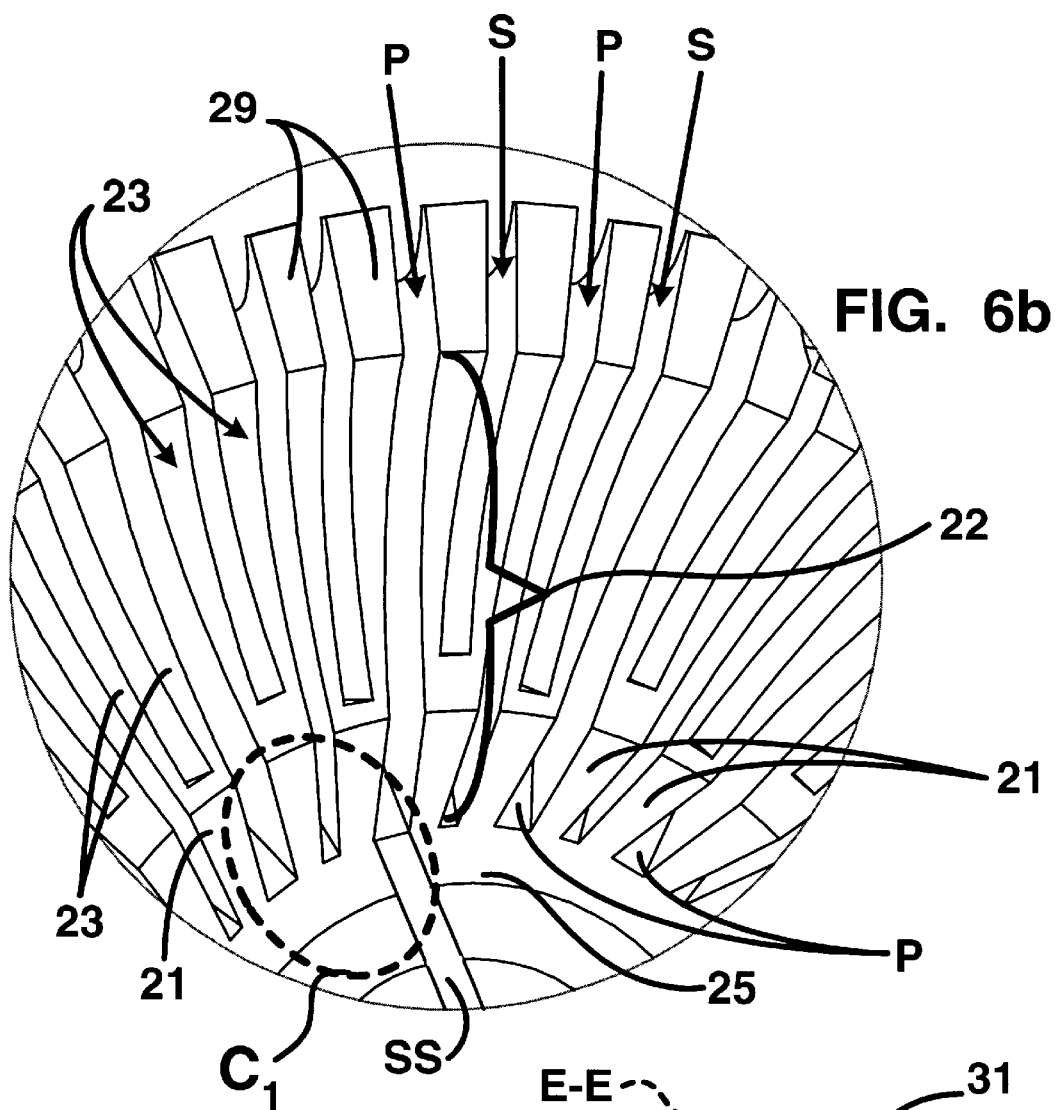
Figure 6A:
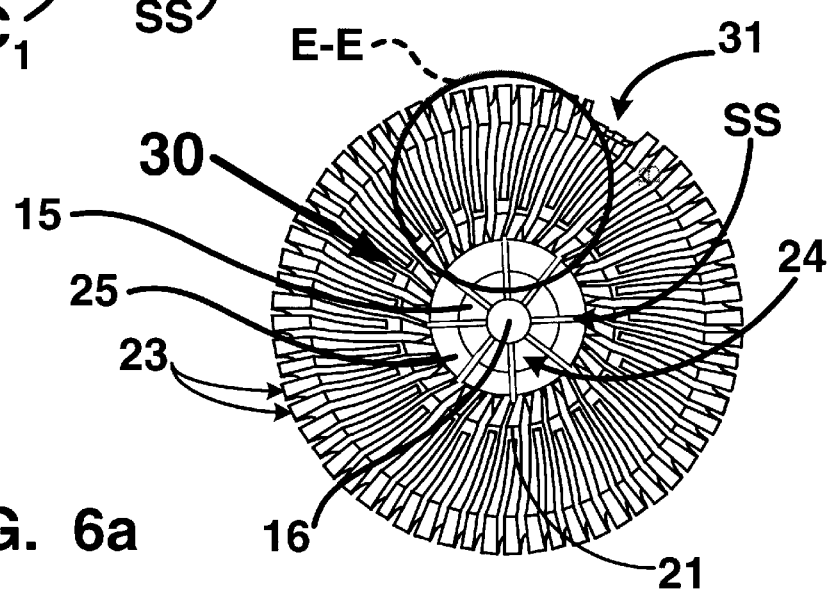
FIG. 6a is a top plan view looking into a chamber of a passive cooling device according to the present invention.

In the following detailed description and in the several figures of the drawings, like elements are identified with like reference numerals.

As shown in the drawings for purpose of illustration, the present invention is embodied in a passive cooling device for dissipating heat from a component. The passive cooling device includes a heat mass, a stem connected with the heat mass and extending outward of the heat mass. The stem is symmetrically positioned about an axis of the heat mass and the stem includes a diverter surface, an end face, and a plurality of stem fins that are spaced apart to define a stem slot between adjacent stem fins. The stem slots extend to the heat mass. A heat conductive base is in contact with the heat mass and includes a mounting surface that is adapted to thermally connect the heat mass with the component.

A plurality of vanes are connected with the heat mass and are spaced apart to define a primary slot between adjacent vanes. The primary slots extend to the heat mass. Each vane also includes at least one secondary slot therein that extends through a portion of the vane and defines a plurality of fins in each vane.

Each vane also includes a top face and an inner wall that includes a first non-planar portion that extends from the stem and terminates at a first intermediate portion that extends to a second non-planar portion that terminates at the top face. The inner wall of all the vanes defines a chamber that surrounds the stem and the chamber includes a cavitation section between the first non-planar portion and the stem. Each vane also includes an outer wall including a third non-planar portion that extends from the base and terminates at a second intermediate portion that terminates at the top face.

The passive cooling device further includes an air flow source for generating an air flow and a duct for channeling the air flow between the air flow source and the passive cooling device. The duct includes a first opening positioned adjacent to the top face and a second opening adapted to connect with the air flow source. Heat is dissipated from the component by the air flow passing over: the stem; the stem fins; the fins; and the vanes, and the air flow flowing through: the stem slots; the primary slots; and the secondary slots, such that heat conducted from the component and into the heat mass is transferred into the air flow.

In FIGS. 1 through 7d, a passive cooling device 10 for dissipating heat from a component (not shown) includes a heat mass 11 and a stem 13 connected with the heat mass 11. The stem 13 extends outward of the heat mass 11 and is symmetrically positioned about an axis Z of the heat mass 11. The stem 13 includes a diverter surface 15, an end face 16, and a plurality of stem fins 24 that are spaced apart to define a stem slot SS between adjacent stem fins 24. The stem slots SS extends to the heat mass 11. A heat conductive base 17 is connected with the heat mass 11 and includes a mounting surface 19 adapted to thermally connect the component with the heat mass 11.

A plurality of vanes 21 are connected with the heat mass 11 and are spaced apart to define a primary slot P between adjacent vanes 21. The primary slot P extends to the heat mass 11. Each vane 21 includes at least one secondary slot S that extends through a portion of the vane 21 to define a plurality of fins 23 in each vane 21. Each vane 21 further includes a top face 29 and an inner wall 22 that includes a first non-planar portion 25 that extends from the stem 13 and terminates at a first intermediate portion 26 that extends to a second non-planar portion 27 that terminates at the top face 29. The inner wall 22 of all of the vane 21 defines a chamber 30 that surrounds the stem 13. The chamber 30 includes a cavitation section $C_1$, (see FIGS. 5, 6b, 8, 9,14, and 15) between the first non-planar portion 25 and the stem 13.

The cavitation section $C_1$, is created by an air flow through the chamber 30 (that is, an air flow into or out of the chamber 30) and not by the physical form of the vanes 21, fins 23, and stem 13 that define the chamber 30. Due to an open space between the first non-planar portion 25 and the stem 13, a low pressure region or a high pressure region is created in the cavitation section $C_1$, in response to a negative air flow or a positive air flow respectively. As those air flows enter the cavitation section $C_1$, cavitation occurs and the air flow circulates over the surfaces of the heat mass 11, the stem 13, and the vanes 21 to increase heat transfer from those surfaces to the air flow.

Each vane 21 also includes an outer wall 32 that includes a third non-planar portion 33 extending from the base 17 and terminating at a second intermediate portion 35 that terminates at the top face 29.

Figure 8:
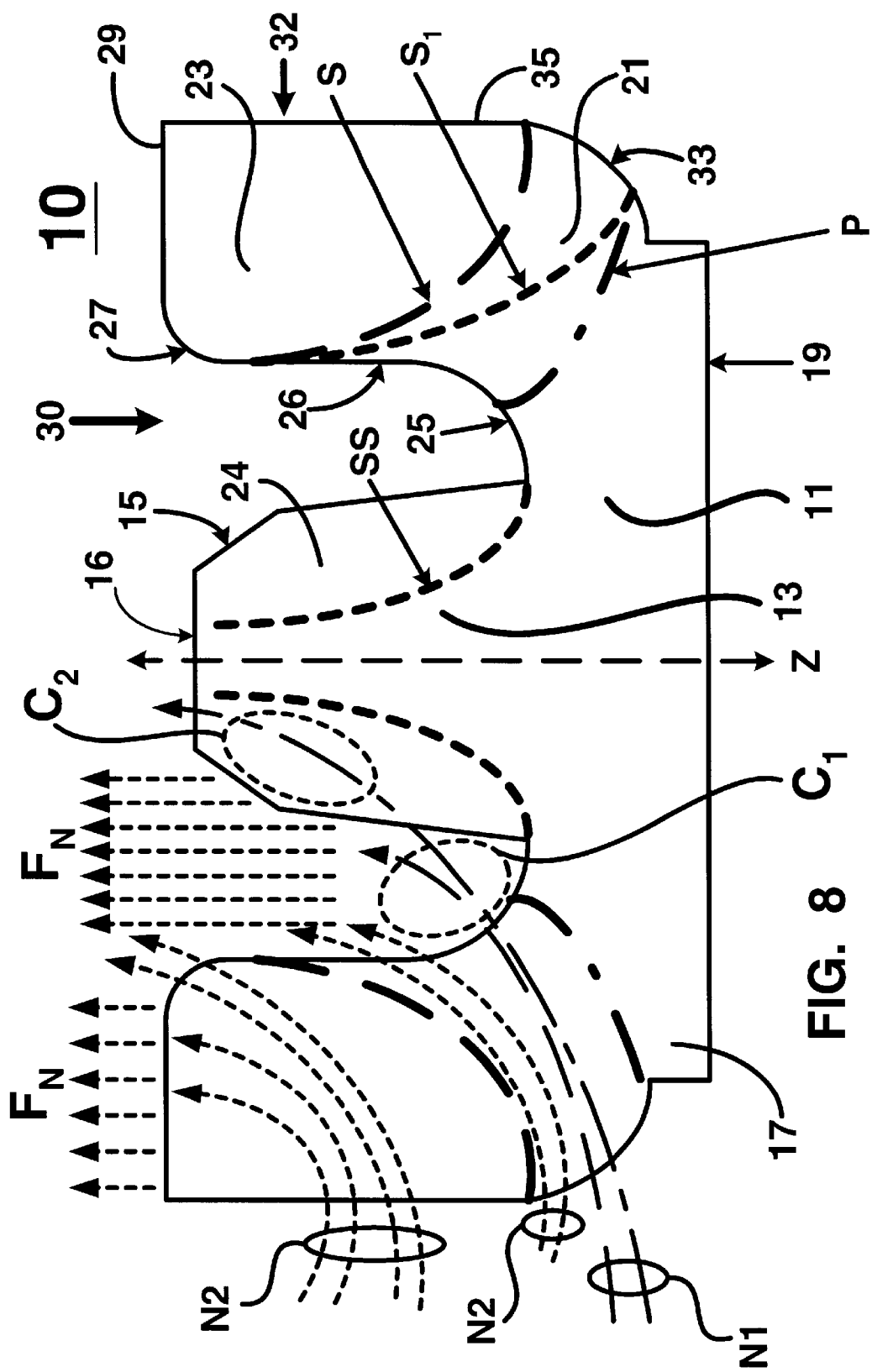
FIG. 8 is a cross-sectional view depicting a negative air flow through a passive cooling device according to the present invention.
Figure 9:
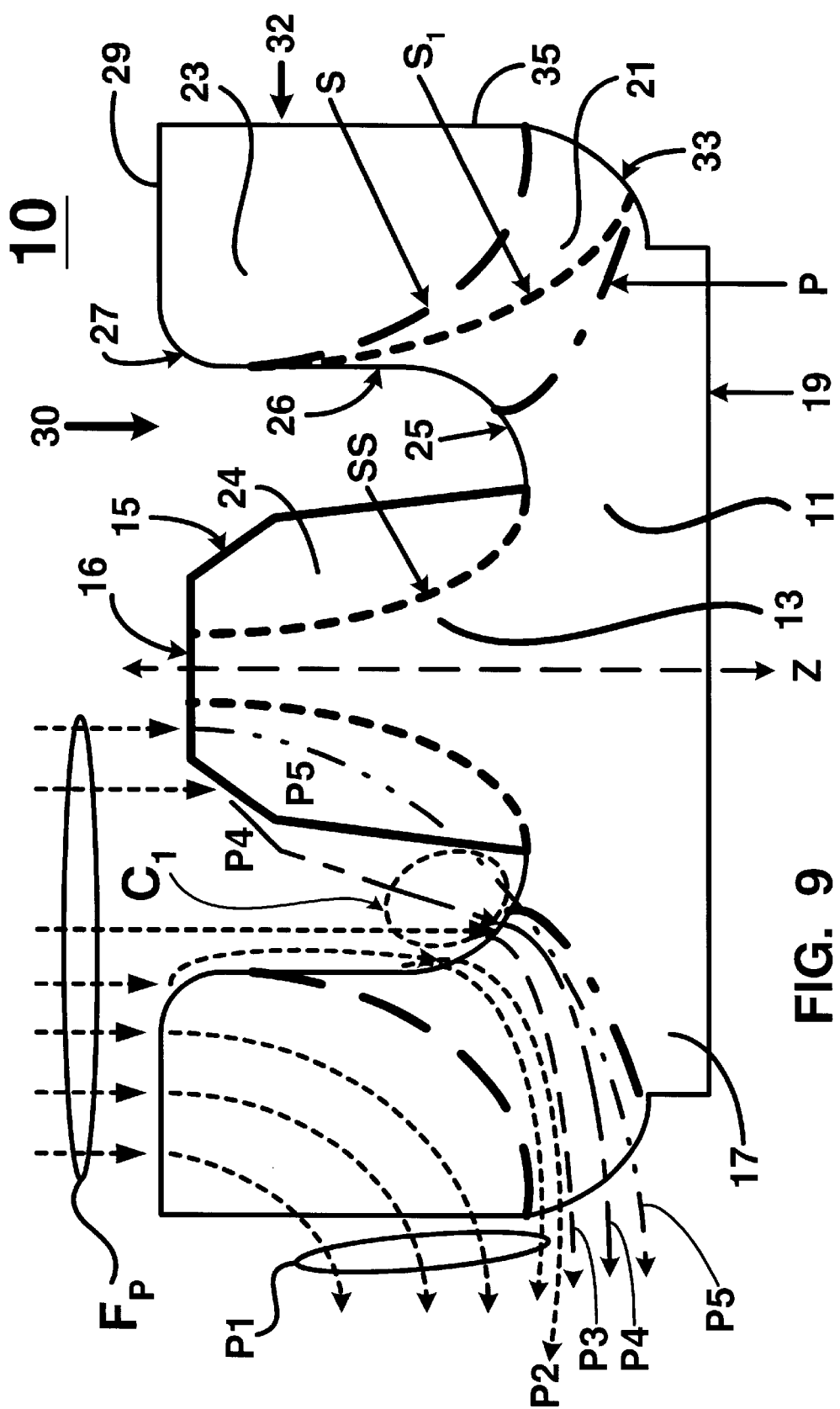
FIG. 9 is a cross-sectional view depicting a positive air flow through a passive cooling device according to the present invention.

The first non-planar portion 25, the second non-planar portion 27, and the third non-planar portion 33 can have profile that is arcuate as depicted in FIGS. 8 and 9, a profile that is sloped, or a profile that is a combination of arcuate and slope profiles.

The first intermediate portion 26 of the inner wall 22 and the second intermediate portion 35 of the outer wall 32 can have a substantially planar profile as depicted in FIGS. 8 and 9, a sloped profile, an arcuate profile, or a combination of substantially planar, slope, and arcuate profiles.

A slope profile as defined herein differs from a substantially planar profile in that a substantially planar profile is substantially parallel with the axis Z; whereas, a sloped profile is at an angle relative to the axis Z.

In FIGS. 7a through 7d, the passive cooling device 10 includes an air flow source 70 for generating an air flow F and a duct 90 for channeling the air flow F between the air flow source 70 and the passive cooling device 10. The duct 90 includes a first opening 91 that is positioned adjacent to the top face 29 of the vanes 21 and a second opening 93 adapted to connect with the air flow source 70.

Heat in the component (not shown) is dissipated by the air flow F passing over the heat mass 11, stem 13, the stem fins 24, the fins 23, and the vanes 21 and the air flow F flowing through the stem slots SS, the primary slots P, and the secondary slots S.

Figure 7A:
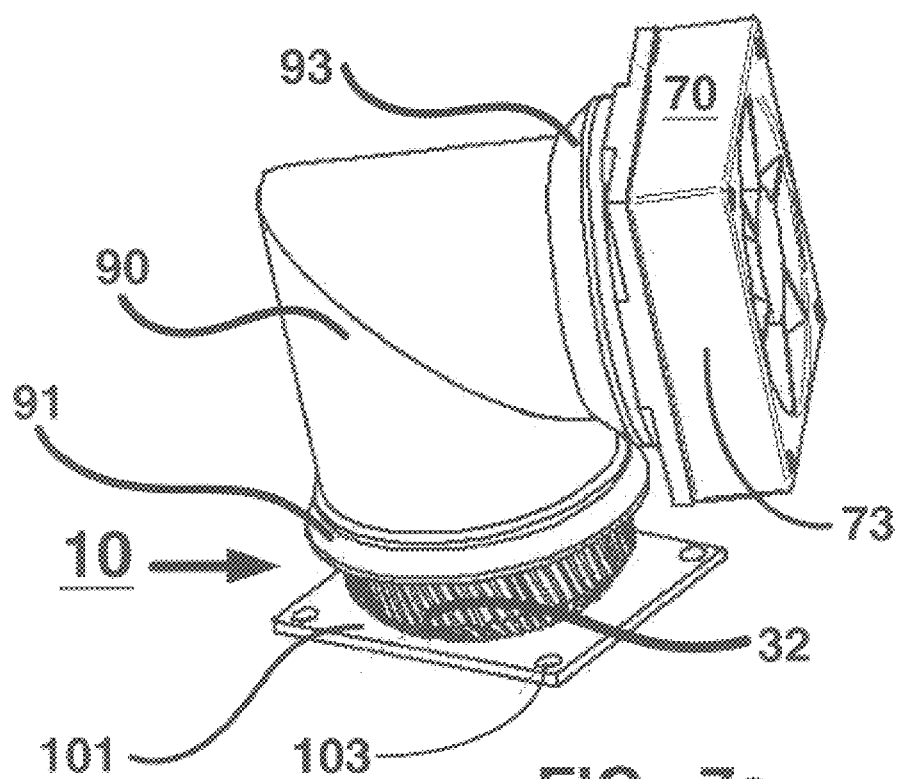
FIGS. 7a and 7b are a profile views of a duct and an airflow source for a passive cooling device according to the present invention.
Figure 7B:
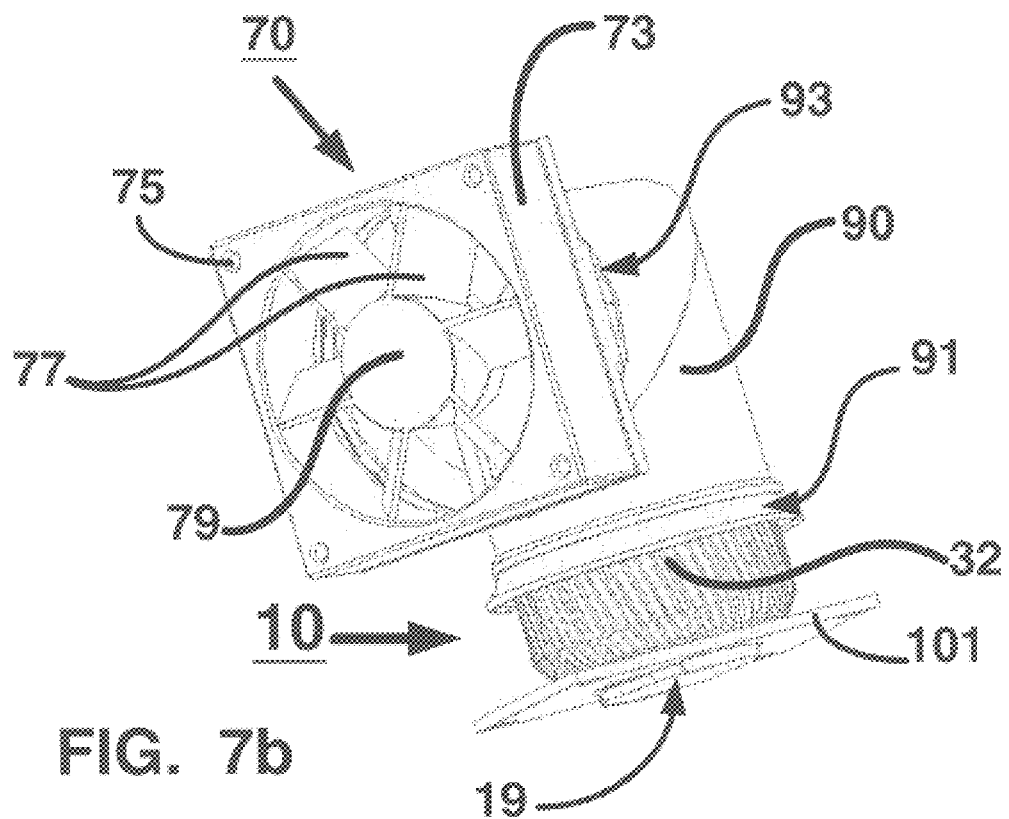
Figure 7C:
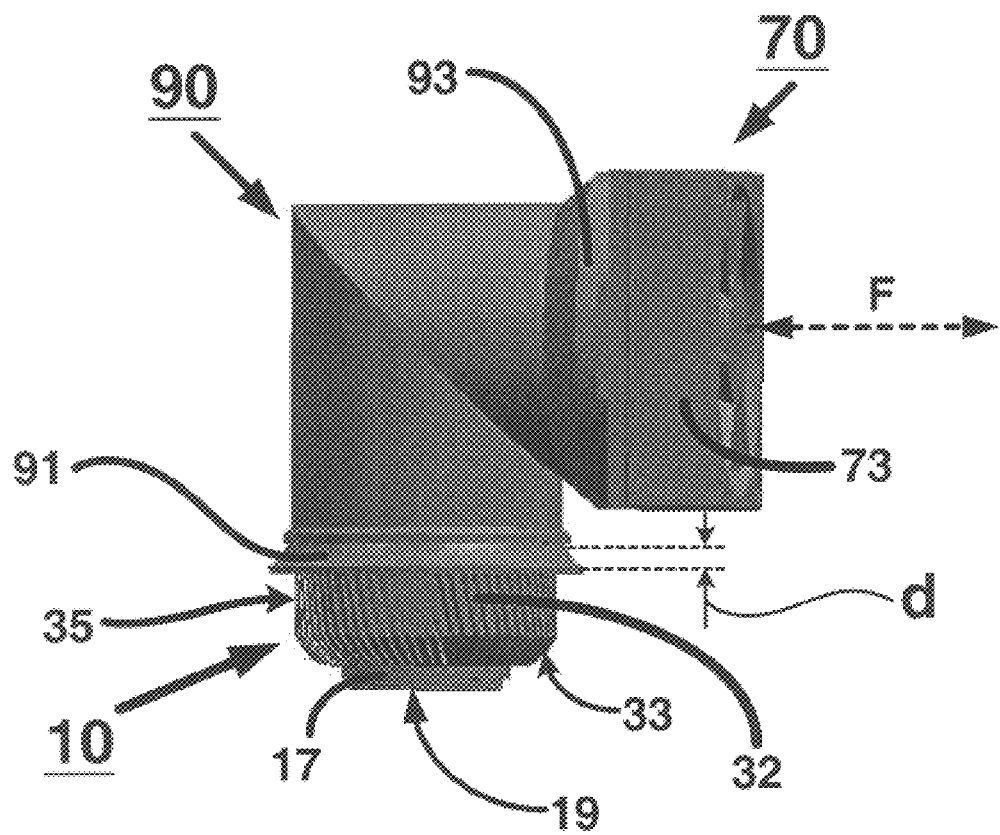
FIG. 7c is a side plan view of duct and an air flow source for a passive cooling device according to the present invention.
Figure 7D:
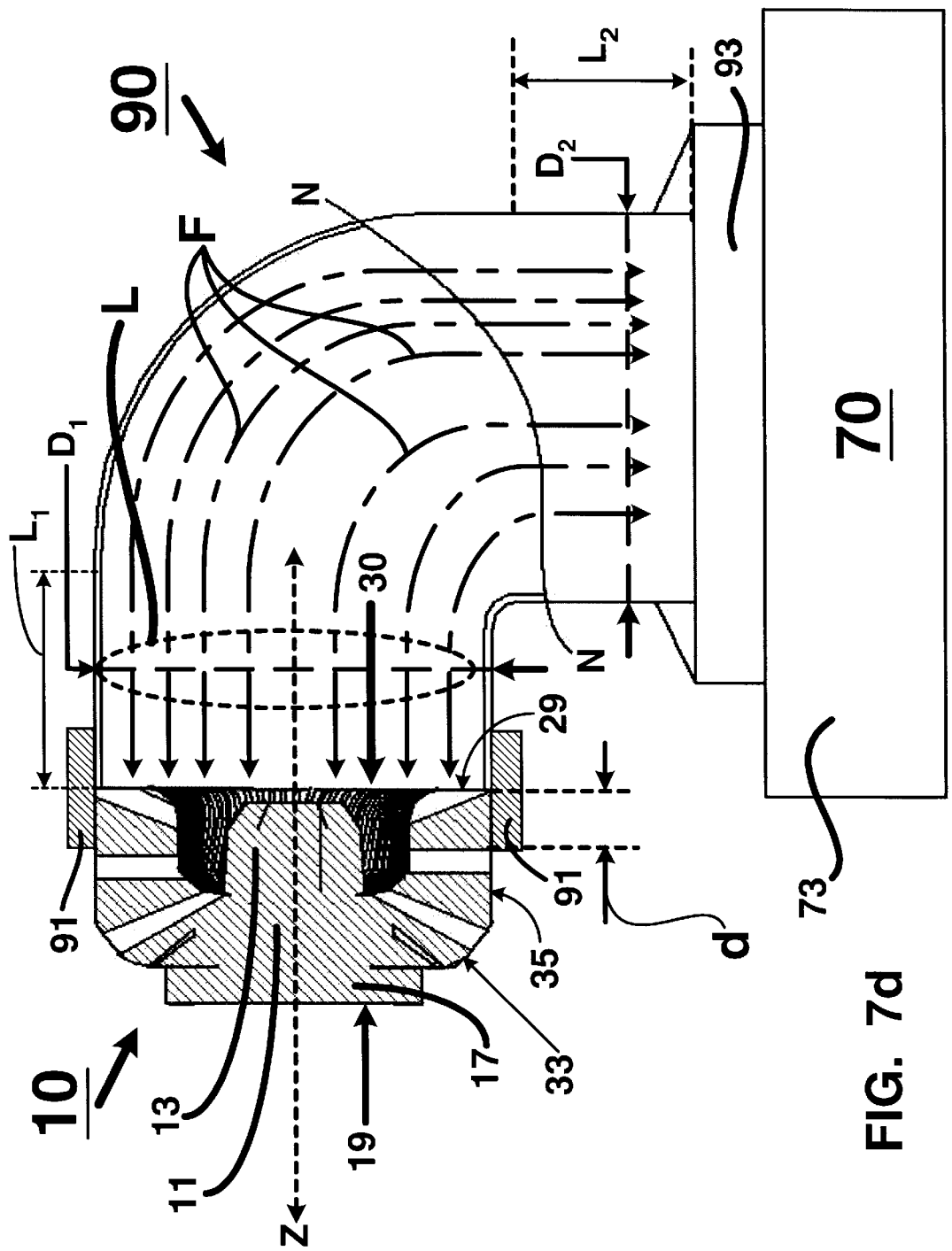
FIG. 7d is a cross-sectional view depicting a duct channeling an air flow according to the present invention.

In FIG. 7d, a cross-sectional view of the duct 90 along line N—N depicts the air flow F from the air flow source 70 as flowing through the duct 90 in either a positive air flow in which air is forced through the passive cooling device 10 in a direction along the axis Z that is from the top face 29 to the base 17 (that is the air flow F enters the chamber 30 via the top face 29) or a negative air flow in which air is drawn through the passive cooling device 10 in a direction along the axis Z that is from the base 17 to the top face 29 (that is the air flow F exits the chamber 30 via the top face 29).

In one embodiment of the present invention, as illustrated in FIG. 8, the air flow F is a negative air flow $F_N$. In this embodiment, air is drawn or pulled through the passive cooling device 10 in a direction from the base 17 to the top face 29 (that is the air flow source 70 is operating in a suction mode). The negative air flow $F_N$ is operative to generate a first low pressure region in the cavitation section $C_1$. The first low pressure region is created by the negative air flow $F_N$ removing the free air available in the cavitation section $C_1$, such that the first low pressure region is a path of least resistance to air flow. As the air moves out of the cavitation section $C_1$ it is replaced by air induced into the cavitation section $C_1$ via the primary slots P and secondary slots S. Those air flows pass over the heat mass 11, the vanes 21, the fins 23, the stem slots SS, and the stem 13 to dissipate heat from those surfaces.

Accordingly, the first low pressure region induces a first intake flow N1 through the primary slots P and the stem slots SS. The first intake flow N1 passes through the first low pressure region and then passes through the chamber 30 and the stem slots SS. The first intake flow N1 dissipates heat from the vanes 21, the stem 13, and the heat mass 11. Moreover, the negative air flow $F_N$ is also operative to induce a second intake flow N2 through the primary slots P and the secondary slots S. The second intake flow N2 dissipates heat from the heat mass 11, the vanes 21, the fins 23, and the stem 13.

One advantage of the negative air flow $F_N$ is that the first low pressure region increases air flow through the primary slots P of the vanes 21 and the stem slots SS of the stem 13 thereby increasing waste heat removal from the vanes 21, the stem 13, and the heat mass 11.

Additionally, the negative air flow $F_N$ is also operative to generate a second low pressure region $C_2$ in the stem slots SS which induces the first intake flow N1 to flow over the heat mass 11, the stem 13, and through the stem slots SS thereby further dissipating heat from those surfaces.

In one embodiment of the present invention, as illustrated in FIG. 7d, the negative air flow $F_N$ is a substantially laminar air flow L that is substantially aligned with the axis Z. The substantially laminar air flow L need not be a laminar flow throughout the entirety of the duct 90. The substantially laminar air flow L need only be a laminar flow that is substantially aligned with the axis Z before it exits the chamber 30 via the top face 29. The negative air flow $F_N$ creates a low pressure region inside the duct 90. The negative air flow $F_N$ flows towards the low pressure region and becomes the substantially laminar air flow L.

Advantages of the substantially laminar air flow L is that it reduces air turbulence with a subsequent reduction in noise generated by the air flow as is passes through the passive cooling device 10. Reductions in noise generated by forced air cooled heat sinks is highly desirable in computers because it reduces noise levels in the home and the workplace.

In another embodiment of the present invention, as illustrate d in FIG. 9, the air flow F is a positive air flow $F_P$. In this embodiment, air pushed or forced through the passive cooling device 10 in a direction from the top face 29 to the base 17. The positive air flow $F_P$ is operative to generate a first high pressure region in the cavitation section $C_1$. The cavitation section $C_1$ is an area in which the positive air flow $F_P$ flows with least resistance and the diverter surface 15 and the second non-planar portion 27 are operative to divert a portion of the positive air flow $F_P$ into the cavitation section $C_1$. As a result, cavitation occurs within the first high pressure region and the positive air flow $F_P$ circulates over the heat mass 11, the stem 13, and the vanes 21 to dissipate heat from those surfaces. The first high pressure also increases the positive air flow $F_P$ through the primary slots P and the stem slots SS thereby increasing waste heat removal from the vanes 21, the stem 13, and the heat mass 11.

The positive air flow $F_P$ diverges into a plurality of air flows through the passive cooling device 10 including a first flow P1, a second flow P2, a third flow P3, a fourth flow P4, and a fifth flow P5. The first flow P1 that passes through the primary slots P and secondary slots S. The first flow P1 dissipates heat from the vanes 21, the fins 23, and the heat mass 11. The second flow P2 is deflected off of the second non-planar portion 27, passes through the chamber 30, and exits through the primary slots P. The second flow P2 dissipates heat from the vanes 21, the fins 23, and the heat mass 11. The third air flow P3 enters the chamber 30 and exits through the primary slots P. The third flow P3 dissipates heat from the vanes 21 and the heat mass 11. The fourth air flow P4 enters the chamber 30 and is deflected off the diverter surface 15 of the stem 13 and exits through the primary slots P. The fourth flow P4 dissipates heat from the vanes 21, the stem 13, and the heat mass 11. The fifth flow P5 passes through the stem slots SS and exits through the primary slots P. The fifth flow P5 dissipates heat from the stem 13, the stem fins 24, the vanes 21, and the heat mass 11. A portion of the positive air flow $F_P$ (P1, P2, P3, P4, and P5) passes through the low pressure region of the cavitation section $C_1$ before exiting through the primary slots P.

The air flow F through the passive cooling device 10 can be increased and/or the removal of waste heat from the heat mass 11 can be increased by extending the secondary slots S of the fins 23 to the heat mass 11 as illustrated in FIGS. 8 and 9 (see dashed line $S_1$). By extending the secondary slots $S_1$ to the heat mass 11, the air flow F through the secondary slots $S_1$ passes over the heat mass 11 and increases waste heat removal from the heat mass 11. The air flow F can be the negative air flow $F_N$ or the positive air flow $F_P$. Although the secondary slots $S_1$ are illustrated as extending to the heat mass 11 on only one side of the axis Z, the secondary slots $S_1$ extend to the heat mass 11 on both sides of the axis Z and have been omitted on one side in order to clearly depict the negative air flow $F_N$ and the positive air flow $F_P$ in FIGS. 8 and 9 respectively.

In one embodiment of the of present invention, as illustrated in FIG. 7d, the positive air flow $F_P$ is a substantially laminar air flow L that is substantially aligned with the axis Z. The substantially laminar air flow L need not be a laminar flow throughout the entirety of the duct 90. The substantially laminar air flow L need only be a laminar flow that is substantially aligned with the axis Z before it enters the chamber 30 via the top face 29. As the positive air flow $F_P$ leaves the air flow source 70, the positive air flow $F_P$ is turbulent. That turbulence is reduced as the positive air flow $F_P$ travels through the duct 90 and transitions to the substantially laminar air flow L prior to entering into the chamber 30. Furthermore, the substantially laminar air flow L can be improved by a 90 degree bend in the duct 90 (see FIGS. 7a through 7d). The 90 degree bend reduces turbulence in the positive air flow $F_P$ and makes the air flow more laminar.

As mentioned above, advantages of the substantially laminar air flow L include reducing air turbulence with a subsequent reduction in noise generated by the air flow as is passes through the passive cooling device 10.

In FIG. 7d, the substantially laminar air flow L (for the positive air flow $F_P$ or the negative air flow $F_N$) can be accomplished by increasing a first length $L_1$ relative to a first diameter $D_1$ of the duct 90. Increasing the first length $L_1$ reduces turbulence and makes the air flow more laminar.

The duct 90 can be made from any material including metal and plastics. The material selected should be compatible with the expected temperature range of the heat generated by the component to be cooled by the passive cooling device 10. Because the first opening 91 can be positioned adjacent to the top face 29 or in contact with the outer wall 32, the material for the first opening 91 and/or the duct 90 should be able to withstand any waste heat that is thermally conducted into the passive cooling device 10.

The duct 90 can have bends, curves, or elbows therein or it can be straight. The duct 90 can have a circular, rectangular, or another type of cross-section. The present invention is not limited to the shapes or configurations of the duct 90 as illustrated or described herein. Moreover, the duct 90 can be a single component or multiple components that are connected with one another.

The shapes for the first and second openings (91, 93) should be selected to complement the shape of the duct and the shapes of the passive cooling device 10 and the air flow source 70. For example, if the air flow source 70 is a fan with a rectangular cross-section and the duct 90 has a circular cross-section, then the second opening 93 should be designed to complement those cross-sectional profiles. Similarly, the first opening 91 should be designed to complement the cross-sectional profiles of the top face 29 and/or outer wall 32 and the duct 90.

In FIGS. 7c and 7d, the first opening 91 of the duct 90 is in contact with a portion d of the outer wall 32. For example, an inner dimension of the first opening 91 can be sized appropriately to fit over an outside dimension of the outer wall 32. Preferably, the portion d is adjacent to the top face 29 and covers only a small portion of the second intermediate portion 35 so that the first opening 91 does not block the primary and secondary slots (P, S) of the vanes and fins (21, 23) respectively so that the air flow F can enter or exit through the primary and secondary slots (P, S). A material such as an O-ring or a gasket may be used to effectuate a seal between the first opening 91 and the outer wall 32, for example. Alternatively, a friction fit or a clamp may be used to connect the first opening 91 with the outer wall 32.

For instance, the duct 90 can be made from a flexible material such as a rubber material and a clamp or the like can be used to connect the first opening 91 with the outer wall 32. A mounting ring adapted to receive a fastener and connected with the outer wall 32 can be used to connect the first opening 91 to the mounting ring using the fasteners. A notch 31 formed in the fins 23 (see FIG. 6b) can mate with a finger (not shown) in the first opening 91 and having a complementary shape so that the duct 90 can be properly aligned with the outer wall 32 and to prevent the first opening 91 from rotating or twisting after mounting with the outer wall 32.

In FIG. 7d, the second opening 93 can be selected to match a diameter of the fan blades (see reference numeral 77 in FIG. 7b) and a second diameter $D_2$ of the duct 90 can be selected to have a smooth and progressive reduction in diameter that complements the dimensions of the second opening 93. The first and second diameters ($D_1$ and $D_2$) need not be equal to each other. A second length $L_2$ of the duct 90 and the second diameter $D_2$ can be selected to facilitate mating of the second opening 93 with the air flow source 70. For example, the second length $L_2$ and the second diameter $D_2$ can be selected to match a complementary fitting on the air flow source 70, such as a collar having an outside diameter that will mate with an inside diameter of the second opening 93. The second length $L_2$ can also be increased to reduce air turbulence in the air flow F as it enters or exits the air flow source 70. The first and second lengths ($L_1$, $L_2$) need not be equal to each other.

The air flow source 70 can be any type of air generating source including but not limited to a dedicated fan, a system fan, a dedicated blower, and a system blower. In FIGS. 7a through 7c, the air flow source 70 is a dedicated fan, that is, a fan that is connected with the second opening 93 of the duct 90 for the sole purpose of providing the air flow F through the passive cooling device 10. The fan includes features commonly found in fans used to cool electronics such as a hub 79 including a plurality of fan blades 77 connected therewith, a fan housing 73, and mounting holes 75 adapted to receive a fastener for connecting the air flow source 70 with the second opening 93. Other fastening means such as clips or the like can also be used to connect the air flow source 70 with the second opening 93. The fan can be a shroudless fan as well. Power leads (not shown) for connecting the air flow source 70 to a source of AC or DC power can be connected with the air flow source 70.

One advantage of the present invention is that the fan blades 77 and the power leads are positioned away from the passive cooling device 10 thereby eliminating the danger of the fan blades 77 coming into contact with the fins 23 or vanes 21 and stalling the air flow source 70 and the danger associated with the power leads being cut or shorted by the fins 23 or vanes 21 is also eliminated. Moreover, by placing the fan blades 77 away from the top face 29 or chamber 30 reduces noise generated by the fan blades 77 resulting in the benefits described above.

A system fan is one in which the fan provides the air flow F through the passive cooling device 10 and a separate air flow for the system that carries the system fan. For example, the system might be a computer, such as a PC, in which the system fan provides an air flow that cools components in the PC and also provides the air flow F through a duct 90 connected with the system fan.

A dedicated blower is an air flow source similar to the above described dedicated fan with the exception that a blower typically incorporates an impeller blade as opposed to axially mounted fan blades. Similarly, a system blower is an air flow source that is similar to the above described system fan with the exception that it incorporates an impeller blade. The type of air flow source 70 used and the amount of air flow F produced by the air flow source 70 will be application dependent.

In either case, the second opening 93 can be designed to accommodate mounting the air flow source 70 with the duct 90. For instance, the duct 90 can be made from a plastic and the second opening 93 can be an integral or separate component that is shaped to complement a housing of the air flow source 70. If a blower is used for the air flow source 70, the duct 90 can be a straight section with no 90 degree bends, for example.

Additionally, another advantage of positioning the air flow source 70 away from the passive cooling device 10 is that the end face 16 of the stem 13 can have a position relative to the top face 29 of the vanes 21 (see dashed line T of FIG. 5) that includes a position that is flush with the top face 29, recessed below the top face 29, or extends outward of the top face 29. If the end face 16 extends beyond the top face 29 (i.e. above the dashed line T) the remote positioning of the air flow source 70 allows for the end face 16 and a portion of the stem 13 to extend into the duct 90 without any danger of contact with the fan blades 77 and the surface area of the stem 13, stem fins 24, and stem slots SS can be increased thereby increasing the surface area available for removing waste heat.

Figure 16A:
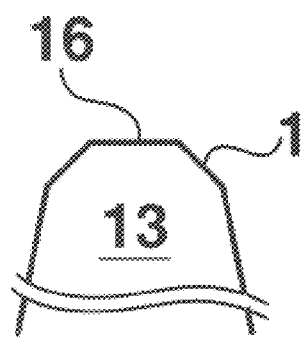
FIGS. 16a, 16b, 16c are cross-sectional views depicting an end face with substantially planar, sloped, and arcuate shapes according to the present invention.
Figure 16B:
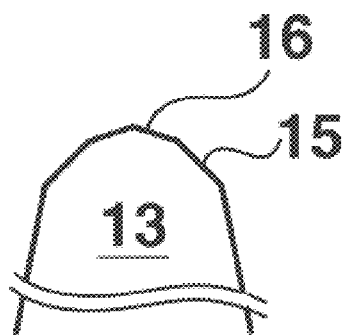
Figure 16C:
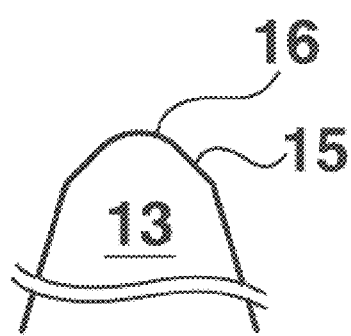

The end face 16 of the stem 13 can have a shape that includes but is not limited to a substantially planar shape (see FIG. 16a), a sloped shape (see FIG. 16b), and an arcuate shape (see FIG. 16c).

Figure 10A:
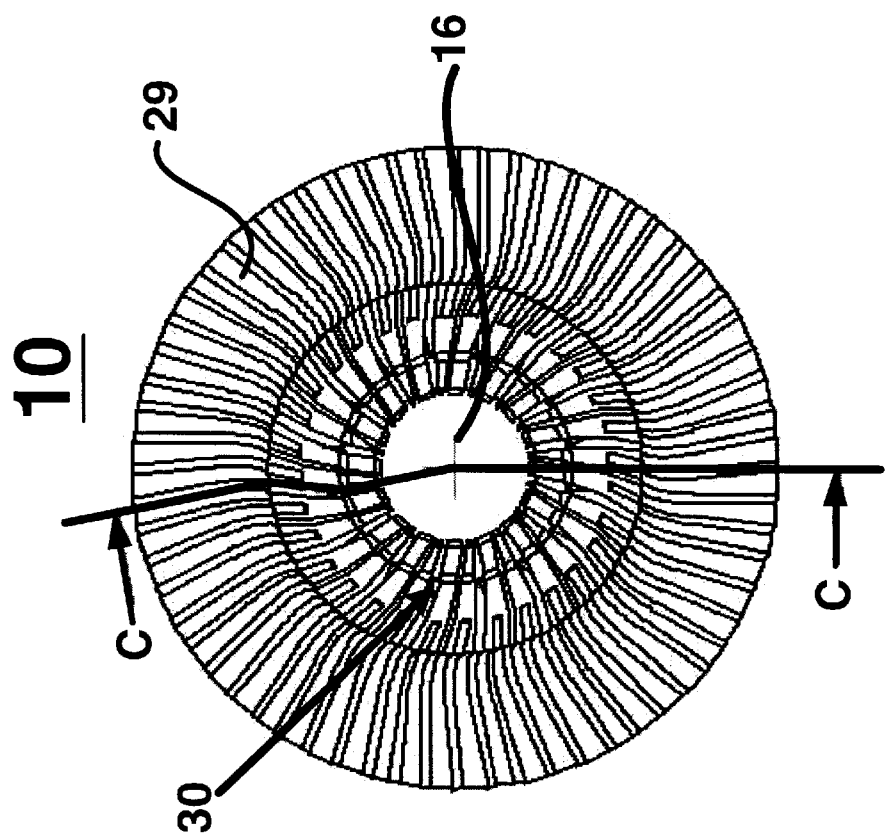
FIG. 10a is a top plan view of a passive cooling device according to the present invention.
Figure 10B:
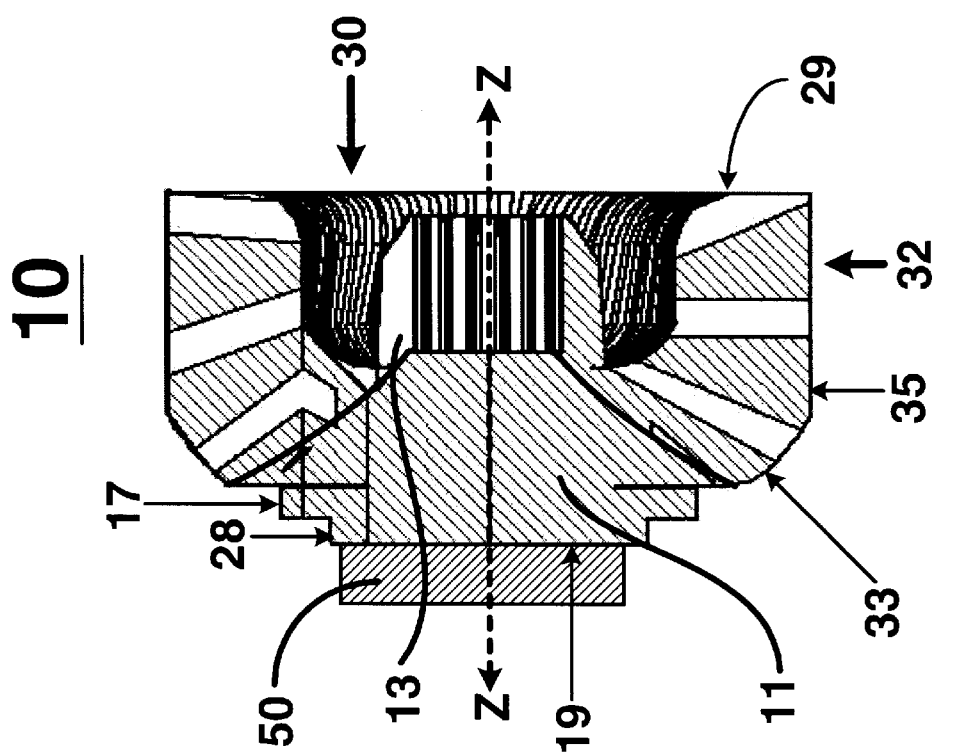

In FIG. 10b, the heat mass 11 is in thermal communication with a component 50 by a direct connection between the mounting surface 19 and the component 50. That is, the component 50 is connected with the mounting surface 19. Alternatively, in FIG. 13b, a thermal interface material 60 is in contact with the mounting surface 19 and the component 50 is in contact with the thermal interface material 60. The thermal interface material 60 is operative to thermally connect the heat mass 11 with the component. In some applications it may be desirable to increase the efficiency of heat transfer between the component 50 and the heat mass 11 by using a thermal interface material.

Suitable materials for the thermal interface material 60 include but are not limited to thermally conductive paste, thermally conductive grease, silicone, parafin, graphite, a coated aluminum (Al) foil, a phase transition material, and carbon fiber. The thermal interface material 60 can be pasted, glued, or screen printed to the mounting surface 19 and/or the component 50.

Figure 12B:
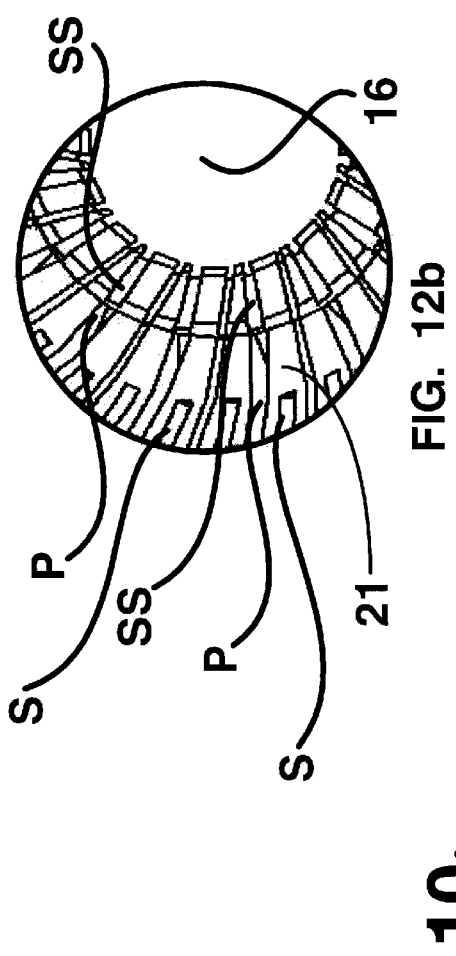
Figure 12A:
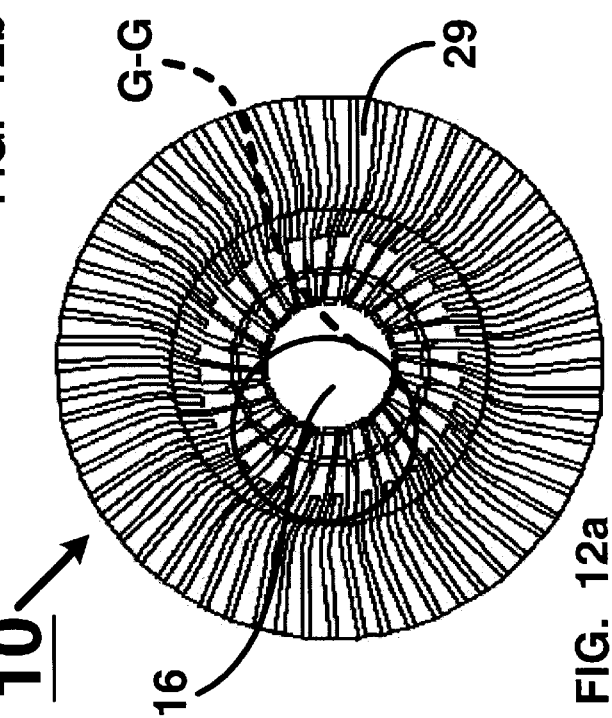
FIG. 12a is a top plan view depicting stem slots which merge with all of the primary slots according to the present invention.

The air flow F through the passive cooling device 10 and waste heat removal from the heat mass 11 can be increased or decreased by preselecting the number of stem slots SS that merge with the primary slots P of the vanes 21. In FIGS. 11a and 11b, the stem slots SS merge with less than all of the primary slots P. For purposes of illustration only, the stem slots SS in FIGS. 11a and 11b merge with every other primary slot P. On the other hand, in another embodiment of the present invention, as illustrated in FIGS. 12a and 12b, the stem slots SS merge with all of the primary slots P. A surface area that comes in contact with the air flow F is increased by increasing the number of stem slots SS with a resulting improvement in heat dissipation from the stem 13, the stem fins 24 and the heat mass 11. The number of stem slots SS that can be formed in the stem 13 will depend on the manufacturing process used. For example, if the stem slots SS are formed by a cutting process, there will be an upper limit on the number of stem slots SS that can be cut in the stem 13 to match the primary slots P.

Figure 13C:
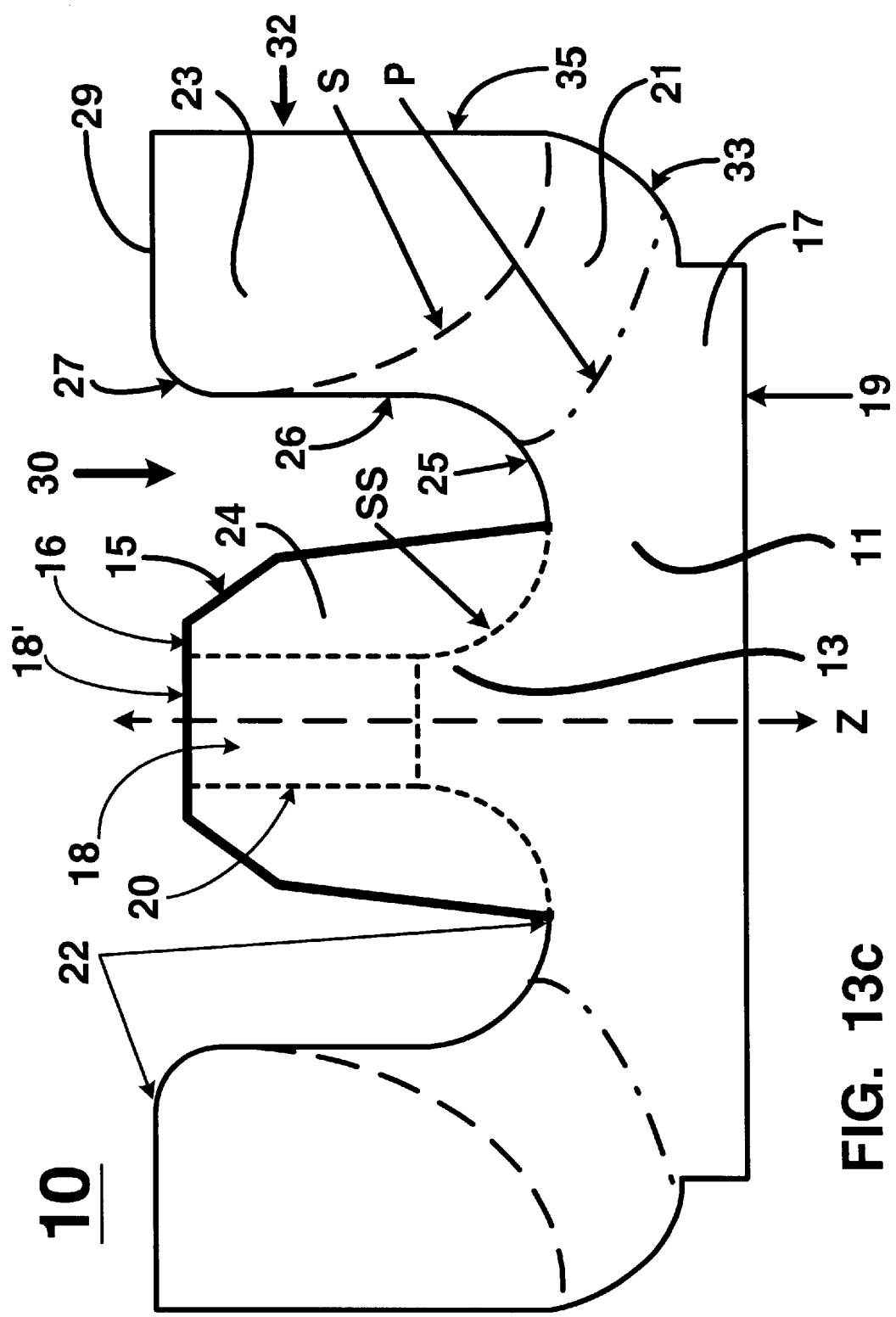

In FIGS. 13a through 13c, the stem 13 can include a stem cavity 18 that is symmetrically positioned about the axis Z and extends inward of the end face 16 (see FIG. 13c). The stem cavity 18 includes an aperture 18' adjacent to the end face 16. The stem slots SS merge with the stem cavity 18 and provide a path for the air flow F to enter into and/or exit from the stem cavity 18 through the stem slots SS and the aperture 18' so that the stem cavity 18 reduces a resistance to the air flow F through the stem slots SS (see reference numeral 20 in FIG. 13c). A diameter of the stem cavity 18 can be such that the end face 16 is eliminated and aperture 18' merges with the diverter surface 15 (see FIGS. 13a and 13b).

Figure 14:
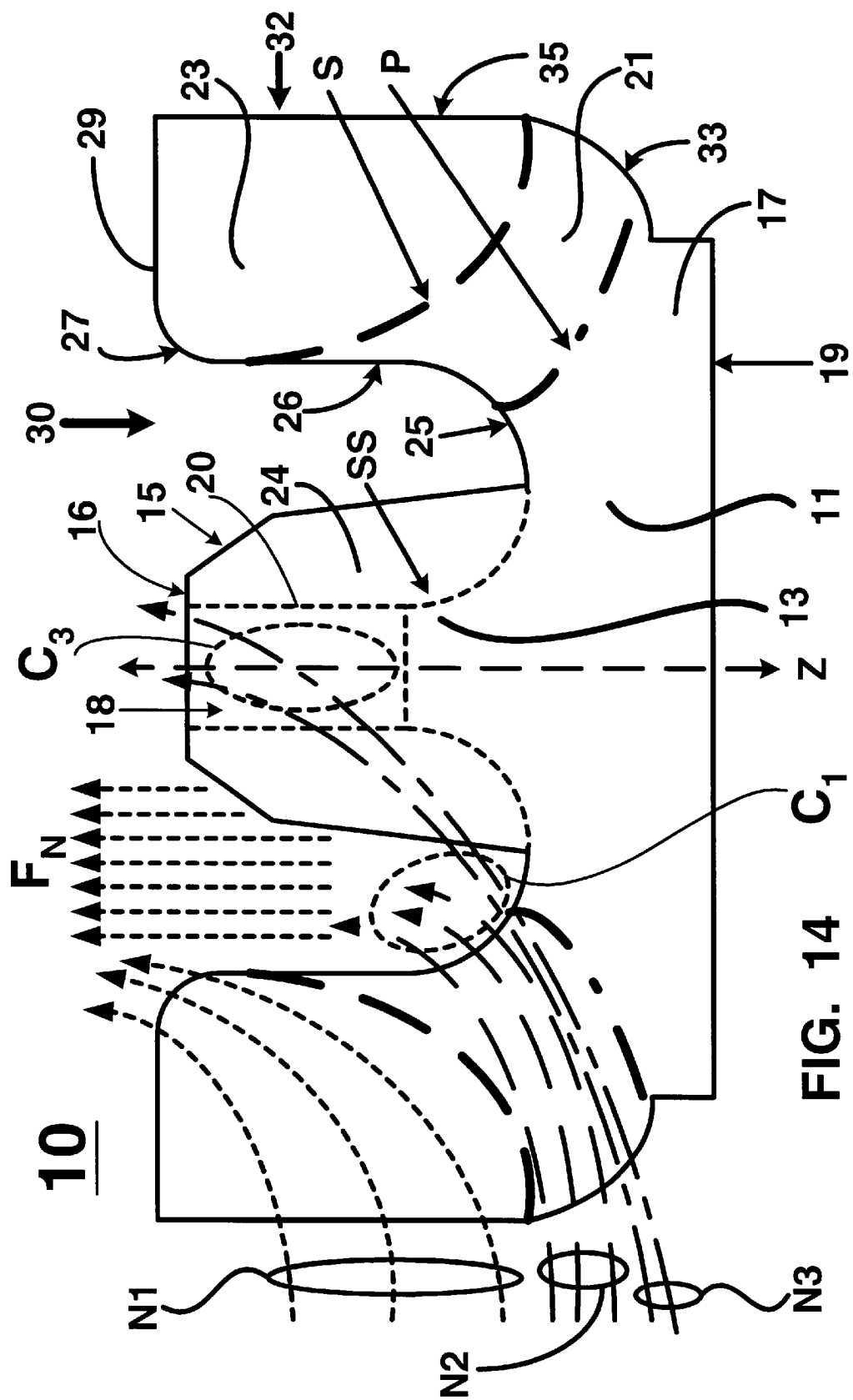
FIG. 14 is a cross-sectional view depicting a negative air flow through a passive cooling with a stem cavity according to the present invention.

In FIG. 14, one advantage of the stem cavity 18 is that it creates a third low pressure region $C_3$ within the stem cavity 18 and the stem slots SS. The negative air flow $F_N$ is operative to induce a third intake flow N3 through the primary slots P and the stem slots SS that passes through the stem slots SS and exits through the stem cavity 18. The third intake flow N3 dissipates heat from the vanes 21, the fins 23, and the stem 13.

The negative air flow $F_N$ induces a second intake flow N2 through the primary slots P. The second intake flow N2 passes through the first low pressure region in the cavitation section $C_1$ and exits the chamber 30. The second intake flow N2 dissipates heat from the vanes 21, the stem 13, and the heat mass 11. The negative air flow $F_N$ is also operative to induce a first intake flow N1 through the secondary slots S. The first intake flow N1 exits through the chamber 30 and the top face 29 of the vanes 21. The first intake flow N1 dissipates heat from the heat mass 11, the vanes 21 and the fins 23.

Figure 15:
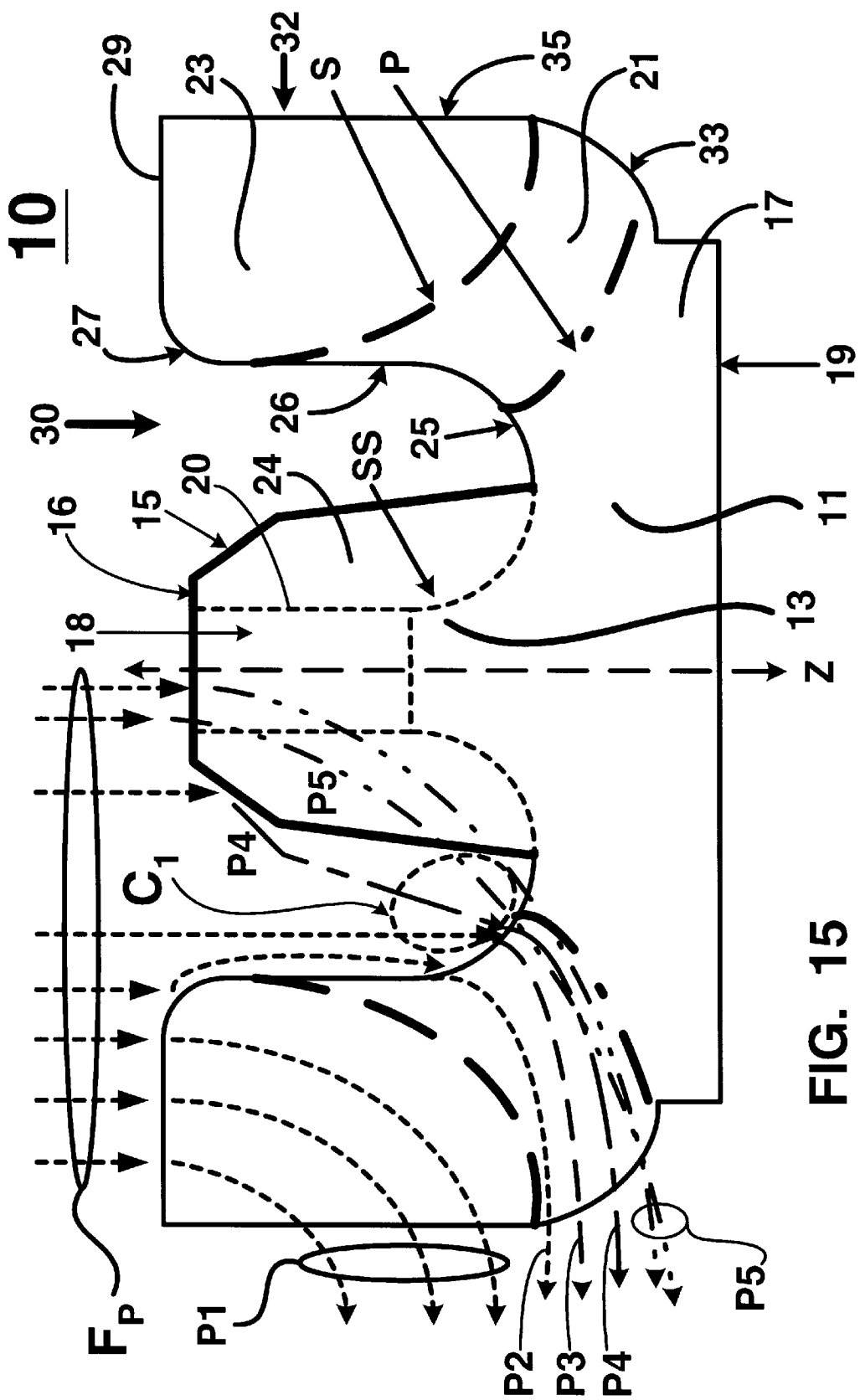
FIG. 15 is a cross-sectional view depicting a positive air flow through a passive cooling with a stem cavity according to the present invention.

In FIG. 15, the stem cavity 18 modifies the positive air flow $F_p$ as described above in reference to FIG. 9 because the fifth flow P5 passes through the stem slots SS before exiting through the primary slots P. The fifth flow P5 dissipates heat from the stem 13, the stem fins 24, the vanes 21, and the heat mass 11. A portion of the fifth flow P5 passes through the first high pressure region in the cavitation section $C_1$ before exiting through the primary slots P. The stem cavity 18 increases the fifth flow P5 thereby increasing heat removal from the stem 13, the heat mass 11, and the vanes 21.

Figure 17A:
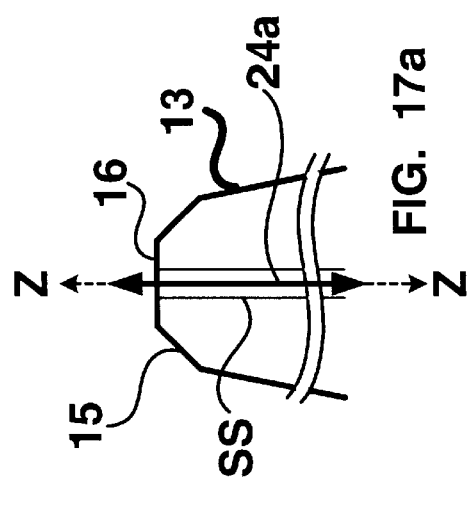
FIGS. 17a and 17b are side views depicting a stem with stem slots that are substantially aligned with an axis and stem slots that are oriented at an angle with the axis respectively according to the present invention.
Figure 17B:
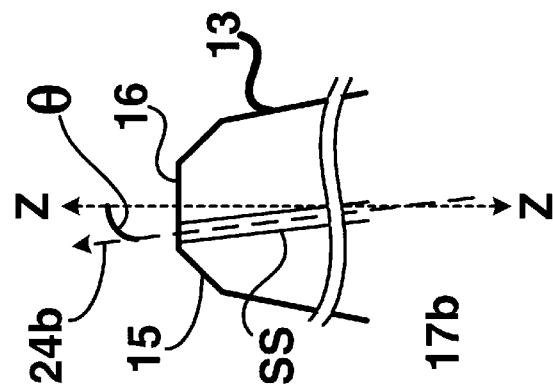

In FIGS. 17a and 17b, the stem slots SS can have an orientation relative the axis Z. In FIG. 17a, the stem slots SS have an orientation that is substantially aligned with the axis Z as depicted by line 24a which is substantially parallel with both the stem slots SS and the axis Z.

In contrast, in FIG. 17b, the stem slots SS are oriented at an angle θ0 with respect to the axis Z as indicated by a line 24b that is substantially parallel with the stem slot SS and makes the angle θ with the axis Z.

One advantage of aligning the stem slots SS with the axis Z is that air flow noise is reduced and the air flow noise is further reduced when the positive air flow $F_P$ is the substantially laminar air flow L. On the other hand, when the stem slots SS are at the angle θ with respect to the axis Z, a resistance to the positive air flow $F_p$ from the stem slots SS to the primary slots P and secondary slots S is reduced. That reduced resistance to the positive air flow $F_p$ also reduces air flow noise and air turbulence and improves heat removal from the stem fins 24, the vane 21, and the fins 23.

Figure 18:
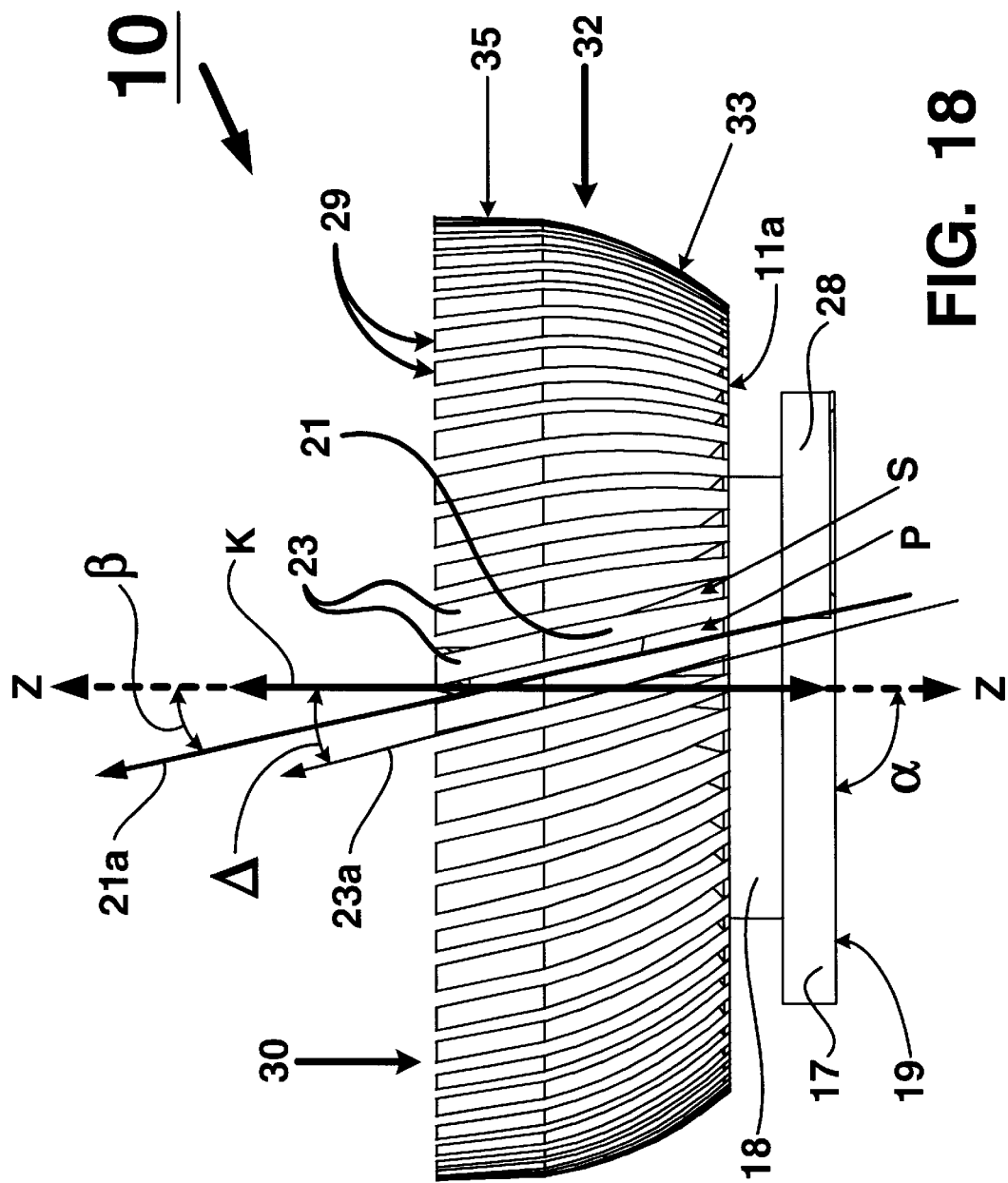
FIG. 18 is a side view depicting substantially aligned and an angular orientation of primary and secondary slots with an axis of a passive cooling device according to the present invention.

In FIG. 18, the primary slots P and the secondary slots S can have an orientation relative to the axis Z that is substantially aligned with the axis Z as indicated by a line K. One advantage to aligning the primary slots P and the secondary slots S with the axis Z is that the air flow F (positive $F_p$ or negative $F_N$) passes through the primary slots P and the secondary slots S with the least resistance to the air flow F. Consequently, air flow noise is reduced.

On the other hand, the primary slots P and the secondary slots S can have an orientation relative to the axis Z that is at an angle with respect to the axis Z as indicated by a line 21a and an angle β for the primary slot P and a line 23a and an angle Δ for the secondary slot S. The angles β and Δ can be identical angles (that is β=Δ) or they can be different from each other (that is β≠Δ). One advantage to orienting the primary slots P and the secondary slots S at an angle with the axis Z is that it increases the surface area available for the air flow F (positive air flow $F_p$ or negative air flow $F_N$) to wet over and increase heat dissipation from the vanes 21, the fins 23, and the heat mass 11. For instance, with a DELTA® AFB0812VHD fan, the angles β and Δ are from about 12 degrees to about 14 degrees. In angling the primary slots P and the secondary slots S it may be necessary to strike a balance between an increase in air flow noise and increase in heat dissipation due to increased surface area. The actual values for the angles β and Δ will be application dependent. The mounting surface 19 of the base 17 can be at an angle α with the axis Z. Preferably, the angle α is perpendicular to the axis Z (i.e. α=90 degrees) to facilitate mounting with the component 50. The base 17 can optionally include an inset portion 18 and a pair of opposed flats 28 (see FIGS. 2 and 4) to facilitate mounting the passive cooling device 10 with a structure such as a base plate 101 (see FIGS. 7a and 7b). The base plate 101 can include holes 103 for connecting the base plate 101 with a PC board or a chip carrier (not shown). Fasteners such as a threaded screw, for example, can be inserted through the holes 103 to connect the base plate 101 with the chip carrier or PC board. The base plate 101 positions the mounting surface 19 in contact with the component 50 so that heat in the component 50 is thermally transferred into the heat mass 11. As previously mentioned, the thermal interface material 60 may optionally be used in conjunction with the mounting surface 19 and/or the component 50.

Suitable materials for the passive cooling device 10 include but are not limited to aluminum (Al), copper (Cu), copper-brass, silver (Ag), silicon substrate (Si), MONEL®, or alloys or combinations of the aforementioned materials. The duct 90 can be made out of materials that include but are not limited to metals, rubber, plastics, asbestos, hard paper, and Therma-coal.

Suitable components for the air flow source 70 include but are not limited to commercially available off-the-shelf DC axial fans, micro blowers, and DC Slim Blowers. The output of the air flow source 70 in cubic feet per minute (CFM) and the air pressure delivered by the air flow source 70 will depend on the total amount of thermal energy to be dissipated from the component 50. The component 50 can be any device from which it is desirable to dissipate heat and includes but is not limited to electronic devices such as ASIC's, microprocessors ($\mu$P's), and the like.

The passive cooling device 10 can be manufactured using a variety of processes. For example, if the passive cooling device 10 is made from aluminum (Al), then a calculated quantity of the aluminum can be forged to form the external shape of the passive cooling device 10. The passive cooling device 10 can be machined to form the base 17 and the mounting surface 19. Next, the passive cooling device 10 can be clamped to an index head and a slitting saw can be used to form the vanes 21, the fins 23, and the stem fins 24. A diameter of the slitting saw, a position of the slitting saw, and a tilt angle of the slitting saw will depend on a root diameter of the vanes 21 and their angle relative to the axis Z. After the slitting process, the passive cooling device 10 can be deburred and degreased. If it is desired to use a base plate 101 (see FIGS. 7a and 7b) to mount the passive cooling device 10 with the component 50, then a suitable base plate 101 can be pressed onto the base 17. A pressure fit or friction fit can be used to fixedly connect the base plate 101 with the base 17, or the mounting surface 19 can be crimped. Additionally, the thermal interface material 60 can be applied to the mounting surface 19 and/or to the component 50 prior to mounting the passive cooling device 10 with the component 50.

Alternatively, the passive cooling device 10 can be machined from bar stock, followed by a brazing process to join the vanes 21 to the heat mass 11. The stem 13 can also be joined to the heat mass 11 using the brazing process. The vanes 21 and the stem 13 can be pre-manufactured prior to their being joined to the heat mass 11 and the secondary slots S can be pre-formed in the vanes 21 to define the fins 23 prior to the brazing process.

Preferably, the heat mass 11, the base 17, the stem 13, the stem fins 24, the vanes 21, and the fins 23 of the passive cooling device 10 are a homogeneously formed unit.

Although several embodiments of the present invention have been disclosed and illustrated, the invention is not limited to the specific forms or arrangements of parts so described and illustrated. The invention is only limited by the claims.

What is claimed is:

1. A passive cooling device for dissipating heat from a component, comprising:

a heat mass;

a stem connected with and extending outward of the heat mass and symmetrically positioned about an axis of the heat mass, the stem including a diverter surface, an end face, and a plurality of stem fins that are spaced apart to define a stem slot therebetween that extends to the heat mass;

a heat conductive base connected with the heat mass and including a mounting surface adapted to thermally connect the component with the heat mass;

a plurality of vanes connected with the heat mass and spaced apart to define a primary slot therebetween that extends to the heat mass, each vane including at least one secondary slot therein that extends through a portion of the vane to define a plurality of fins in the vane, each vane including a top face, and an inner wall including a first non-planar portion extending from the stem and terminating at a first intermediate portion that extends to a second non-planar portion that terminates at the top face, the inner wall of all the vanes defining a chamber that surrounds the stem and including a cavitation section between the first non-planar portion and the stem, and an outer wall including a third non-planar portion extending from the base and terminating at a second intermediate portion that terminates at the top face;

an air flow source for generating an air flow; and a duct for channeling the air flow between the air flow source and the passive cooling device, the duct including a first opening positioned adjacent to the top face and a second opening adapted to connect with the air flow source, and wherein heat is dissipated from the component by the air flow passing over the heat mass, the stem, the stem fins, the fins, and the vanes and flowing through the stem slots, the primary slots, and the secondary slots.

2. The passive cooling device as set forth in claim 1, wherein the air flow is a negative air flow operative to generate a first low pressure region in the cavitation section, the first low pressure region inducing a first intake flow through the primary slots and the stem slots, the negative air flow is operative to generate a second low pressure region in the stem slots which induces the first intake flow to flow through the stem slots, and the negative air flow is operative to induce a second intake flow through the primary and secondary slots.

3. The passive cooling device as set forth in claim 2, wherein the negative air flow is a substantially laminar air flow that is substantially aligned with the axis.

4. The passive cooling device as set forth in claim 1, wherein the air flow is a positive air flow operative to generate a first high pressure region in the cavitation section, the positive air flow including a first flow passing through the primary and secondary slots, a second air flow that is deflected off the second non-planar portion and exits through the primary slots, a third air flow entering the chamber and exiting through the primary slots, a fourth air flow that is deflected off the diverter surface and exiting through the primary slots, and a fifth air flow passing through the stem slots and exiting through the primary slots, and wherein a portion of the first, second, third, fourth, and fifth air flows passes through the through the first low pressure region.

5. The passive cooling device as set forth in claim 3, wherein the positive air flow is a substantially laminar air flow that is substantially aligned with the axis.

6. The passive cooling device as set forth in claim 1, wherein the heat mass is thermally connected with the component by a direct connection between the mounting surface and the component.

7. The passive cooling device as set forth in claim 1 and further comprising a thermal interface material connected with the mounting surface and operative to thermally connect the heat mass with the component.

8. The passive cooling device as set forth in claim 1, wherein a selected one or more of the first non-planar portion, the second non-planar portion, and the third non-planar portion includes a profile selected from the group consisting of an arcuate profile, a sloped profile, and a combination of arcuate and slope profiles.

9. The passive cooling device as set forth in claim 1, wherein a selected one or more of the first intermediate portion of the inner wall and the second intermediate portion of the outer wall includes a profile selected from the group consisting of a substantially planar profile, a slope profile, an arcuate profile, and a combination of substantially planar, arcuate, and sloped profiles.

10. The passive cooling device as set forth in claim 1, wherein the air flow source is a source selected from the group consisting of a dedicated fan, a system fan, a dedicated blower and a system blower.

11. The passive cooling device as set forth in claim 1, wherein the stem slots merge with less than all of the primary slots of the vanes.

12. The passive cooling device as set forth in claim 1, wherein the stem slots merge with all of the primary slots of the vanes.

13. The passive cooling device as set forth in claim 1, wherein the end face of the stem has a position relative to the top face of the vanes selected from the group consisting of a position that is substantially flush with the top face of the vanes, a position that is recessed below the top face of the vanes, and a position that extends outward of the top face of the vanes.

14. The passive cooling device as set forth in Claim 1, wherein the end face has a shape selected from the group consisting of a substantially planar shape, a sloped shape, and an arcuate shape.

15. The passive cooling device as set forth in claim 1, wherein the stem includes a stem cavity symmetrically positioned about the axis and extending inward of the end face and including an aperture adjacent to the end face, the stem slots merge with the stem cavity, and the stem cavity is operative to reduce a resistance to the air flow through the stem slots.

16. The passive cooling device as set forth in claim 1, wherein the secondary slots of the fins extend to the heat mass.

17. The passive cooling device as set forth in claim 1, wherein the stem slots have an orientation relative to the axis selected from the group consisting of substantially aligned with the axis and at an angle with respect to the axis.

18. The passive cooling device as set forth in claim 1, wherein the primary slots and the secondary slots have an orientation relative to the axis selected from the group consisting of substantially aligned with the axis and at an angle with respect to the axis.

19. The passive cooling device as set forth in claim 1, wherein the first opening of the duct is in contact with a portion of the outer wall.

20. The passive cooling device as set forth in claim 1, wherein the heat mass, the base, the stem, the stem fins, the vanes, and the fins are a homogeneously formed unit.

* * * * *